(12) United States Patent
Yamazaki et al.

(10) Patent No.: US 11,690,245 B2
(45) Date of Patent: Jun. 27, 2023

(54) LIGHT-EMITTING MODULE

(71) Applicant: Semiconductor Energy Laboratory Co., Ltd., Atsugi (JP)

(72) Inventors: Shunpei Yamazaki, Setagaya (JP); Kaoru Hatano, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/550,171

(22) Filed: Dec. 14, 2021

(65) Prior Publication Data

US 2022/0181584 A1 Jun. 9, 2022

Related U.S. Application Data

(63) Continuation of application No. 16/207,435, filed on Dec. 3, 2018, which is a continuation of application (Continued)

(30) Foreign Application Priority Data

May 21, 2009 (JP) .................... 2009-122664

(51) Int. Cl.
*H01L 51/52* (2006.01)
*H01L 51/56* (2006.01)
(Continued)

(52) U.S. Cl.
CPC ...... *H01L 51/5253* (2013.01); *H01L 51/0097* (2013.01); *H01L 51/5237* (2013.01);
(Continued)

(58) Field of Classification Search
CPC .................................................. H01L 27/3244
See application file for complete search history.

(56) References Cited

U.S. PATENT DOCUMENTS 5,650,363 A 7/1997 Endroes et al.
6,035,180 A 3/2000 Kubes et al.
(Continued)

FOREIGN PATENT DOCUMENTS

EP 1858042 A 11/2007
EP 1860531 A 11/2007
(Continued)

OTHER PUBLICATIONS

"Section 2 of Defendant Intervention Participant's 2nd Brief (dated Nov. 1, 2021) in Japanese Case No. REIWA 3 (WA) 6763", Nov. 1, 2021, pp. 112-201.
(Continued)

*Primary Examiner* — Joseph L Williams
(74) *Attorney, Agent, or Firm* — Robinson Intellectual Property Law Office; Eric J. Robinson

(57) ABSTRACT

An object of one embodiment of the present invention is to provide a more convenient highly reliable light-emitting device which can be used for a variety of applications. Another object of one embodiment of the present invention is to manufacture, without complicating the process, a highly reliable light-emitting device having a shape suitable for its intended purpose. In a manufacturing process of a light-emitting device, a light-emitting panel is manufactured which is at least partly curved by processing the shape to be molded after the manufacture of an electrode layer and/or an element layer, and a protective film covering a surface of the light-emitting panel which is at least partly curved is formed, so that a light-emitting device using the light-emitting panel has a more useful function and higher reliability.

8 Claims, 15 Drawing Sheets

Related U.S. Application Data

No. 14/507,280, filed on Oct. 6, 2014, now Pat. No. 10,804,489, which is a continuation of application No. 12/781,876, filed on May 18, 2010, now Pat. No. 8,911,653.

(51) Int. Cl.
*H01L 51/00* (2006.01)
*H01L 27/32* (2006.01)

(52) U.S. Cl.
CPC .......... *H01L 51/5246* (2013.01); *H01L 51/56* (2013.01); *H01L 27/3244* (2013.01); *H01L 2251/5338* (2013.01); *H01L 2251/566* (2013.01); *Y02E 10/549* (2013.01); *Y02P 70/50* (2015.11); *Y10T 29/49117* (2015.01)

(56) References Cited

U.S. PATENT DOCUMENTS

| | | |
|---|---|---|
| 6,573,652 B1 | 6/2003 | Graff et al. |
| 6,605,826 B2 | 8/2003 | Yamazaki et al. |
| 6,956,324 B2 | 10/2005 | Yamazaki |
| 7,067,976 B2 | 6/2006 | Yamazaki |
| 7,129,102 B2 | 10/2006 | Yamazaki |
| 7,166,006 B2 | 1/2007 | Cok |
| 7,190,503 B2 | 3/2007 | Ide |
| 7,372,200 B2 | 5/2008 | Yamazaki |
| 7,551,255 B2 | 6/2009 | Jeong et al. |
| 7,753,751 B2 | 7/2010 | Yamazaki |
| 7,884,808 B2 | 2/2011 | Joo |
| 7,911,455 B2 | 3/2011 | Nishikawa et al. |
| 8,237,355 B2 | 8/2012 | Yamazaki |
| 8,493,331 B2 | 7/2013 | Krah et al. |
| 8,749,492 B2 | 6/2014 | Kotera et al. |
| 8,754,867 B2 | 6/2014 | Krah et al. |
| 8,786,178 B2 | 7/2014 | Yamazaki |
| 8,911,653 B2 | 12/2014 | Yamazaki et al. |
| 9,092,086 B2 | 7/2015 | Krah et al. |
| 9,147,713 B2 | 9/2015 | Yamazaki |
| 9,430,087 B2 | 8/2016 | Krah et al. |
| 9,530,829 B2 | 12/2016 | Yamazaki |
| 9,990,084 B2 | 6/2018 | Krah et al. |
| 10,747,355 B2 | 8/2020 | Krah et al. |
| 10,804,489 B2 | 10/2020 | Yamazaki et al. |
| 10,910,597 B2 | 2/2021 | Yamazaki et al. |
| 11,005,071 B2 | 5/2021 | Yamazaki et al. |
| 11,106,308 B2 | 8/2021 | Krah et al. |
| 2002/0158666 A1 | 10/2002 | Azami et al. |
| 2003/0134488 A1 | 7/2003 | Yamazaki et al. |
| 2003/0162312 A1 | 8/2003 | Takayama et al. |
| 2003/0201974 A1 | 10/2003 | Yin |
| 2004/0085020 A1 | 5/2004 | Handa et al. |
| 2005/0164470 A1 | 7/2005 | Yamazaki et al. |
| 2006/0216909 A1 | 9/2006 | Yamazaki et al. |
| 2007/0085138 A1 | 4/2007 | Yamazaki et al. |
| 2008/0049437 A1 | 2/2008 | Takayama et al. |
| 2008/0223708 A1 | 9/2008 | Joo |
| 2008/0309625 A1 | 12/2008 | Krah et al. |
| 2009/0001881 A1 | 1/2009 | Nakayama |
| 2009/0002357 A1 | 1/2009 | John et al. |
| 2009/0091551 A1 | 4/2009 | Hotelling et al. |
| 2009/0124062 A1 | 5/2009 | Yamazaki et al. |
| 2011/0101351 A1 | 5/2011 | Yamazaki |
| 2011/0250724 A1 | 10/2011 | Suzawa et al. |
| 2013/0271410 A1 | 10/2013 | Krah et al. |
| 2014/0132860 A1 | 5/2014 | Hotelling et al. |
| 2014/0232686 A1 | 8/2014 | Kotera et al. |
| 2014/0240287 A1 | 8/2014 | Krah et al. |
| 2014/0347490 A1 | 11/2014 | Takayama et al. |
| 2015/0301681 A1 | 10/2015 | Krah et al. |
| 2016/0147343 A1 | 5/2016 | Zhou et al. |
| 2016/0216808 A1 | 7/2016 | Hotelling et al. |
| 2016/0364078 A1 | 12/2016 | Krah et al. |
| 2017/0104047 A1 | 4/2017 | Yamazaki |
| 2017/0125454 A1 | 5/2017 | Takayama et al. |
| 2018/0275820 A1 | 9/2018 | Krah et al. |
| 2019/0115564 A1 | 4/2019 | Yamazaki et al. |
| 2019/0302932 A1 | 10/2019 | Hotelling et al. |
| 2019/0371831 A1 | 12/2019 | Takayama et al. |
| 2020/0312891 A1 | 10/2020 | Takayama et al. |
| 2020/0371637 A1 | 11/2020 | Krah et al. |

FOREIGN PATENT DOCUMENTS

| | | |
|---|---|---|
| JP | 62-153794 | 9/1987 |
| JP | 01-287529 A | 11/1989 |
| JP | 05-062781 A | 3/1993 |
| JP | 07-114347 A | 5/1995 |
| JP | 2000-311781 A | 11/2000 |
| JP | 2001-519585 | 10/2001 |
| JP | 2002-280170 A | 9/2002 |
| JP | 2002-297066 A | 10/2002 |
| JP | 2002-328643 A | 11/2002 |
| JP | 2003-086354 A | 3/2003 |
| JP | 2003-086359 A | 3/2003 |
| JP | 2003-092189 A | 3/2003 |
| JP | 2003-229548 A | 8/2003 |
| JP | 2005-019082 A | 1/2005 |
| JP | 2005-134460 A | 5/2005 |
| JP | 2005-302436 A | 10/2005 |
| JP | 2006-126817 A | 5/2006 |
| JP | 2007-025620 A | 2/2007 |
| JP | 2007-073403 A | 3/2007 |
| JP | 2007-316847 A | 12/2007 |
| JP | 2007-326259 A | 12/2007 |
| JP | 2008-159309 A | 7/2008 |
| JP | 2008-243772 A | 10/2008 |
| JP | 2009-031750 A | 2/2009 |
| JP | 2009-054141 A | 3/2009 |
| JP | 2010-541109 | 12/2010 |
| JP | 2011-171702 A | 9/2011 |
| JP | 2011-233877 A | 11/2011 |
| JP | 6364112 | 7/2018 |
| JP | 6734906 | 8/2020 |
| WO | WO-1999/018590 | 4/1999 |
| WO | WO-2006/095684 | 9/2006 |
| WO | WO-2009/046363 | 4/2009 |

OTHER PUBLICATIONS

"Notice of Trial (Japanese Patent No. 6734906)", dated Nov. 2, 2021.

"Section 2 of Defendant Intervention Participant's 5th Brief (dated May 16, 2022) in Japanese Case No. REIWA 3 (WA) 6763", May 16, 2022, pp. 5-29.

"Oral Prceedings Statement Brief of Invalidation 2021-800094 (Japanese Patent No. 6734906) filed on Sep. 21, 2022", pp. 13-31.

Heisei 17, Patent application technology trend search report, Organic EL element (summary version), Apr. 1, 2006, pp. 1-68, Patent Office.

"Organic EL (Electroluminescence)", https://xtech.nikkei.com/dm/article/WORD/20051021/109962/, Oct. 21, 2005.

Organic EL display, http://www.s-graphics.co.jp/nanoelectronics/kaitai/oel/5.htm.

Softbank and Apple will release iPhone 3G in Japan from Jul. 11, https://www.apple.com/jp/newsroom/2008/06/09Softbank-and-Apple-to-Bring-iPhone-3G-to-Japan-on-July-11/, Jun. 10, 2008.

iPhone3G/3GS Front panel replacement repair, https://www.iphone-support.jp/case/front_panel3g3gs/.

IPhone repair process 1 (purchase parts), https://ykr.ykr414.com/2010/03/10/iphone_repair002/, May 7, 2018.

"Peripheral", Kojien 5th edition, Nov. 11, 1998, p. 1252, Iwanami shoten.

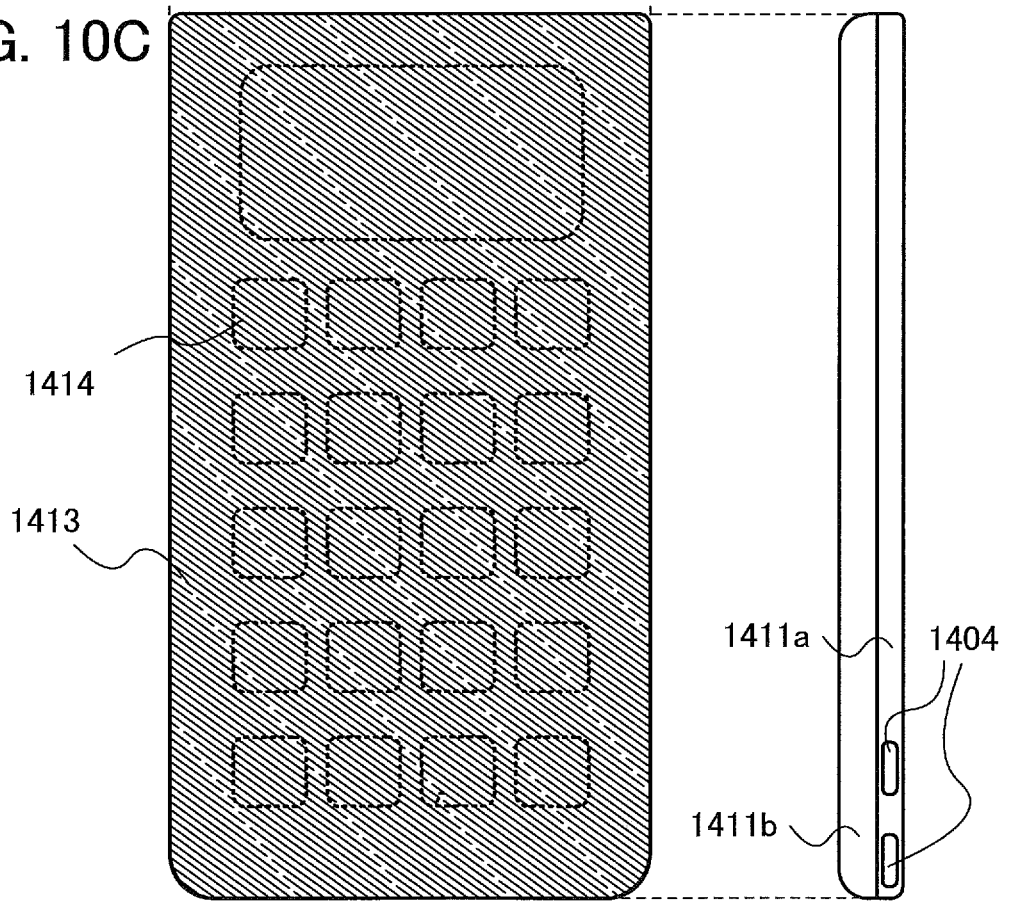

FIG. 13A
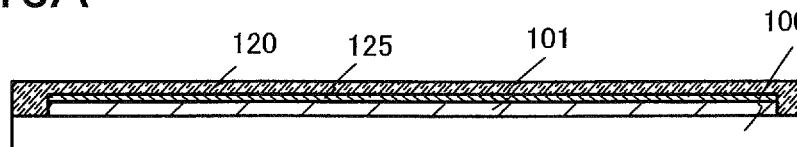
FIG. 13B
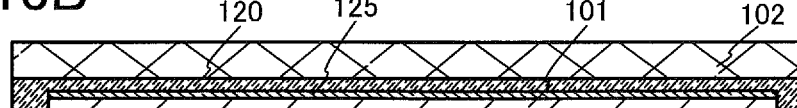
FIG. 13C
FIG. 13D
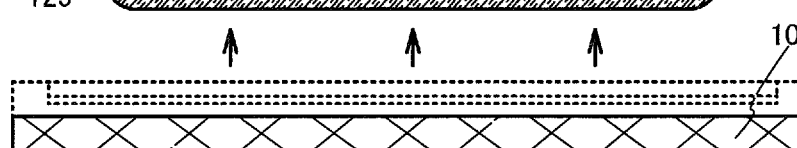
FIG. 13E
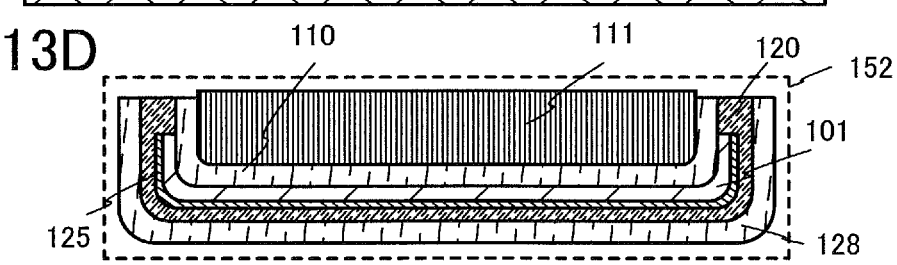

LIGHT-EMITTING MODULE

BACKGROUND OF THE INVENTION

1. Field of the Invention

The present invention relates to a light-emitting device and a manufacturing method thereof.

2. Description of the Related Art

In recent years, light-emitting devices have been used in a variety of places for a variety of applications and therefore have been required to have various characteristics and shapes. Accordingly, light-emitting devices serving their intended purposes have been actively developed.

For example, as a light-emitting device which is provided for an amusement machine, a display whose display surface is curved so that players can experience stereoscopic effect has been reported (e.g., see Patent Document 1).

As the light-emitting device, a light-emitting device having a light-emitting element (hereinafter also referred to as an EL element) exhibiting electroluminescence (hereinafter also referred to as EL), which is lightweight and can realize high contrast and wide viewing angle, is used.

REFERENCE

Patent Document

[Patent Document 1] Japanese Published Patent Application No. H7-114347

SUMMARY OF THE INVENTION

However, the EL element easily deteriorates due to a contaminant such as moisture which enters from outside and this deterioration is one of the factors that reduce reliability of a light-emitting device.

Thus, an object of one embodiment of the present invention is to provide a more convenient highly reliable light-emitting device which can be used for a variety of applications. Another object of one embodiment of the present invention is to manufacture, without complicating the process, a highly reliable light-emitting device having a shape suitable for its intended purpose.

In a manufacturing process of a light-emitting device, a light-emitting panel is manufactured which is at least partly curved by processing the shape to be molded after the manufacture of an electrode layer and/or an element layer, and a protective film covering a surface of the light-emitting panel which is at least partly curved is formed, so that a light-emitting device using the light-emitting panel has a more useful function and higher reliability.

The shape of the light-emitting device can be freely determined by selecting the shape of a mold used for shaping the light-emitting device. Accordingly, it is possible to manufacture various kinds of light-emitting devices capable of being used in a variety of places for a variety of applications, which allows a highly convenient light-emitting device to be provided.

In addition, in the case where the light-emitting panel in which the electrode layer and/or the element layer has been manufactured and then the protective film has been formed is processed into a shape having a curved portion, shape defects such as damage of the protective film due to the shape processing occur. In contrast, it is possible to prevent occurrence of shape defects such as damage of the protective film due to the shape processing of the light-emitting panel in such a manner that the protective film is formed on the light-emitting panel that has been processed into the shape having the curved portion. As a result, the protective film which is a dense film blocks moisture or other impurities from the outside, and contamination of a light-emitting device can be efficiently prevented.

According to one embodiment of the invention disclosed in this specification, a light-emitting panel having a light-emitting element between a pair of flexible sealing members is formed, the light-emitting panel is processed into a shape at least partly curved, and a protective film is formed to cover the light-emitting panel which is processed into the shape at least partly curved.

According to another embodiment of the invention disclosed in this specification, a light-emitting panel having a light-emitting element between a pair of flexible sealing members is formed, the light-emitting panel is processed into a shape at least partly curved and held by a supporting member, and a protective film is formed to cover the light-emitting panel which is processed into the shape at least partly curved.

According to another embodiment of the invention disclosed in this specification, a first sealing member which is at least partly curved and provided with a first electrode layer is formed; an EL layer is formed over the first electrode layer; a second electrode layer is formed over the EL layer; a second sealing member is disposed so that the first electrode layer, the EL layer, and the second electrode layer are sealed between the first sealing member and the second sealing member to form a light-emitting panel which is at least partly curved; and a protective film is formed to cover the light-emitting panel which is at least partly curved.

According to another embodiment of the invention disclosed in this specification, a first sealing member provided with a first electrode layer is provided in contact with an inner surface of a supporting member which is at least partly curved; an EL layer is formed over the first electrode layer; a second electrode layer is formed over the EL layer; a second sealing member is disposed so that the first electrode layer, the EL layer, and the second electrode layer are sealed between the first sealing member and the second sealing member to form a light-emitting panel which is at least partly curved; and a protective film is formed to cover the light-emitting panel which is at least partly curved.

In the above-described structures, another protective film may be formed between the sealing member which seals the light-emitting element (e.g., a flexible substrate) and the light-emitting element.

The light-emitting device may include a sensor portion. For example, a touch sensor (a touch panel) can be provided in a supporting member on the viewer side.

Note that the ordinal numbers such as "first" and "second" are used for convenience and do not denote the order of steps and the stacking order of layers. In addition, the ordinal numbers in this specification do not denote particular names which specify the present invention.

Note that a semiconductor device in this specification refers to all the devices that can operate by using semiconductor characteristics, and an electro-optical device, a semiconductor circuit, and an electronic appliance are all included in the semiconductor device.

The shape of the light-emitting device can be freely determined by selecting the shape of a mold used for shaping the light-emitting device. Accordingly, it is possible to manufacture various kinds of light-emitting devices capable of being used in a variety of places for a variety of applications, which allows a highly convenient light-emitting device to be provided.

It is possible to prevent occurrence of shape defects such as damage of the protective film due to the shape processing of the light-emitting panel because the protective film is formed on the light-emitting panel that has been processed into the shape having the curved portion. As a result, the protective film which is a dense film blocks moisture or other impurities from the outside, and contamination of a light-emitting device can be efficiently prevented.

BRIEF DESCRIPTION OF THE DRAWINGS

FIGS. 10A to 10D are views illustrating an example of a cellular phone to which a light-emitting device is applied;

FIGS. 13A to 13E are views illustrating a method for manufacturing a light-emitting device;

DETAILED DESCRIPTION OF THE INVENTION

Figure 1A:
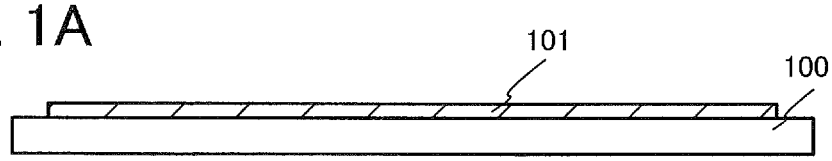
FIGS. 1A to 1F are views illustrating a method for manufacturing a light-emitting device.
Figure 1B:
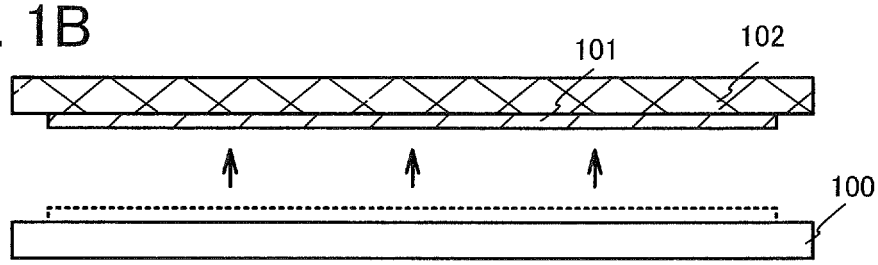

Embodiments of the present invention will be described in detail with reference to the accompanying drawings. However, the present invention is not limited to the following description, and various changes for the modes and details thereof will be apparent to those skilled in the art unless such changes depart from the spirit and the scope of the invention. Therefore, the present invention should not be interpreted as being limited to the description of the embodiments below. In the structures described below, the same portions or portions having similar functions are denoted by the same reference numerals in different drawings, and description thereof will not be repeated.

Embodiment 1

A light-emitting device will be described with reference to FIGS. 1A to 1F and FIGS. 5A and 5B.

FIGS. 1A to 1F and FIGS. 5A and 5B are cross-sectional views illustrating a light-emitting device and a method for manufacturing a light-emitting device.

The light-emitting device includes a light-emitting element having at least a first electrode layer, an EL layer, and a second electrode layer; and a pair of sealing members which seals the light-emitting element therebetween. The light-emitting device may also be provided with a semiconductor element, preferably a thin film transistor. In the case of an active matrix light-emitting device, a driving thin film transistor is provided in each pixel.

Although an active matrix light-emitting device is shown as an example in this embodiment, this embodiment can also be applied to a passive matrix light-emitting device.

In this embodiment, a light-emitting panel is manufactured which is at least partly curved by processing the shape to be molded after the manufacture of an electrode layer of a light-emitting element and/or an element layer including a semiconductor element, and a protective film covering a surface of the light-emitting panel which is at least partly curved is formed, so that a light-emitting device using the light-emitting panel has a more useful function and higher reliability.

An element layer 101 is formed over a manufacturing substrate 100 (see FIG. 1A). The element layer 101 includes a thin film transistor. Next, the element layer 101 is transferred to a supporting substrate 102 (see FIG. 1B).

The manufacturing substrate 100 may be selected as appropriate in a manner that depends on the manufacturing process of the element layer 101. For example, a glass substrate, a quartz substrate, a sapphire substrate, a ceramic substrate, a metal substrate having an insulating layer on its surface, or the like can be used as the manufacturing substrate 100. A plastic substrate having heat resistance which can withstand the processing temperature may also be used.

Figure 1C:
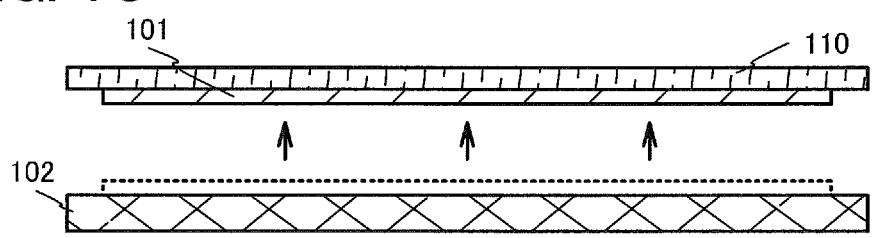
Figure 1D:
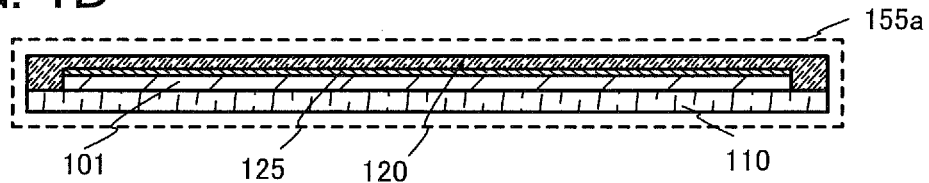

The element layer 101 is transferred from the supporting substrate 102 to a first sealing member 110 (see FIG. 1C).

A light-emitting element 125 electrically connected to the element layer 101 is formed, and a second sealing member 120 covering the element layer 101 and the light-emitting element 125 is formed. Accordingly, a flexible light-emitting panel 155a is manufactured in which the element layer 101 and the light-emitting element 125 which are sealed between the first sealing member 110 and the second sealing member 120 are included (see FIG. 1D).

Figure 5A:
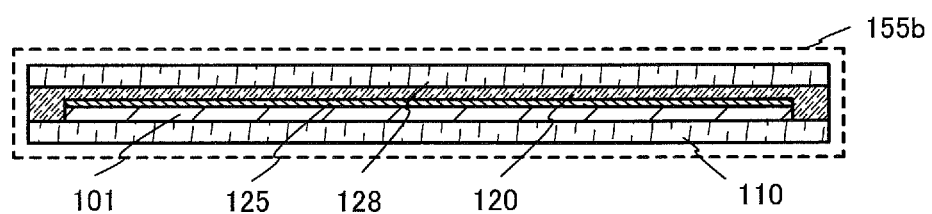
FIGS. 5A and 5B are views illustrating a light-emitting device.
Figure 5B:
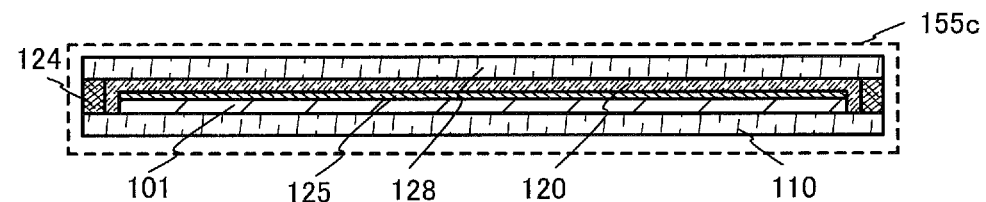

The flexible light-emitting panel 155a is at least sealed between a pair of sealing members, which may be a substrate or a film as long as it is flexible. The light-emitting panel 155a is an example in which the first sealing member 110 having a shape of a plate and the second sealing member 120 having a shape of a resin layer are used. As a sealing means, a plurality of sealing members which attach the sealing members to each other or sealing members having different shapes may be used. FIGS. 5A and 5B illustrate other examples of a flexible light-emitting panel.

FIG. 5A illustrates an example, which is a flexible light-emitting panel 155b in which a third sealing member 128 having a shape of a plate is further provided over the second sealing member 120 having a shape of a resin layer. In addition, FIG. 5B illustrates another example, which is a flexible light-emitting panel 155c in which the first sealing member 110 and the third sealing member 128 are further attached to each other with a sealant 124.

An ultraviolet curable resin or a thermosetting resin can be used for the sealing member having a shape of a resin layer like the second sealing member 120. For example, polyvinyl chloride (PVC), acrylic, polyimide, an epoxy resin, a silicone resin, polyvinyl butyral (PVB), or ethylene vinyl acetate (EVA) can be used. When a hygroscopic substance such as a desiccating agent is used as the sealing member, or a hygroscopic substance is added to the sealing member, higher moisture absorbing effect can be achieved and deterioration of elements can be prevented.

As the sealant 124, it is typically preferable to use a visible light curable resin, an ultraviolet light curable resin, or a thermosetting resin. Typically, an acrylic resin, an epoxy resin, an amine resin, or the like can be used. The sealant 124 may include a photopolymerization initiator (typically, an ultraviolet light polymerization initiator), a thermosetting agent, a filler, or a coupling agent.

The attachment step of the first sealing member 110 and the third sealing member 128 with the sealant 124 may be performed under reduced pressure.

As the supporting substrate 102, the first sealing member 110, and the third sealing member 128, a film or substrate having flexibility (a flexible substrate) is used. However, the first sealing member 110, the second sealing member 120, and the third sealing member 128 that have been shaped and fixed do not need to have flexibility. The supporting substrate 102, the first sealing member 110, the second sealing member 120, and the third sealing member 128 can be formed using an aramid resin, a polyethylene naphthalate (PEN) resin, a polyether sulfone (PES) resin, a polyphenylene sulfide (PPS) resin, a polyimide (PI) resin, or the like. Alternatively, a prepreg that is a structure body in which a fiber is impregnated with an organic resin may be used. In the case where there is no necessity of a light-transmitting property, a metal film such as stainless steel may also be used.

A protective film such as an inorganic insulating film may be provided for the sealing members. For example, when the protective film is provided on the element layer 101 side in the first sealing member 110, the protective film can block a contaminant from entering the element layer 101 from outside or the first sealing member 110. In addition, when the protective film is provided outside (the side opposite to the side where the element layer 101 is formed) in the first sealing member 110, the protective film can block a contaminant from entering the first sealing member 110 itself and thus deterioration can be prevented.

A hygroscopic substance serving as a desiccating agent may be provided for the sealing members. For example, a film of a hygroscopic substance such as barium oxide may be formed on the sealing members with a sputtering method.

Note that in this specification, the attachment between the sealing member or a supporting member and the element layer or the light-emitting element can be performed using a bonding layer. The element layer is attached to the supporting substrate in the transferring step preferably using an adhesive which can be separated later. For example, the supporting substrate is temporary bonded to the element layer and the like, using a water-soluble adhesive, so that the supporting substrate may be separated from the element layer by washing with water.

Figure 1E:
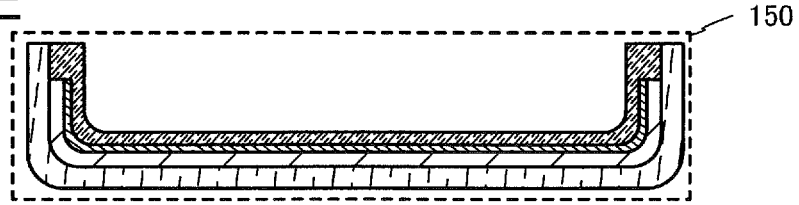

The shape of the flexible light-emitting panel 155a is processed to be bent, whereby a light-emitting panel 150 having a curved portion is manufactured (see FIG. 1E). The shape processing may be performed using a support which serves as a mold of the light-emitting panel.

Figure 1F:
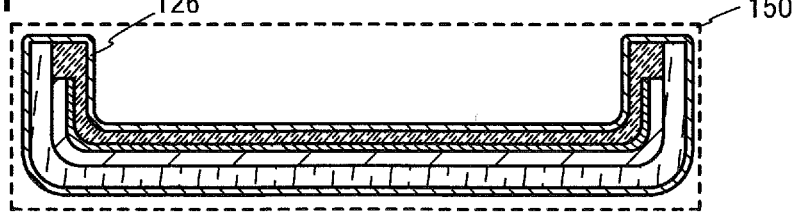

A protective film 126 is formed to cover the light-emitting panel 150 (see FIG. 1F). The shape of the light-emitting panel 150 having the curved portion (see FIG. 1E) can be made to correspond to the shape of the protective film owing to thinness of the protective film 126.

Since the protective film 126 is formed on the light-emitting panel 150 that has been processed into the shape having the curved portion, it is possible to prevent occurrence of shape defects such as damage of the protective film 126 due to the shape processing of the light-emitting panel 150. As a result, the protective film 126 which is a dense film blocks moisture or other impurities from the outside, and the contamination of a light-emitting device having the light-emitting panel 150 can be efficiently prevented.

The protective film 126 can be formed with the following method which depends on a material thereof: a sputtering method, a CVD method, an evaporation method, a SOG method, spin coating, dipping, spray coating, a droplet discharging method (e.g., an ink-jet method, screen printing, or offset printing), doctor knife, roll coater, curtain coater, knife coater, or the like. Examples of the inorganic material used for the protective film 126 include silicon oxide, silicon nitride, silicon oxynitride, aluminum oxide, aluminum nitride, and aluminum oxynitride. Preferably, the protective film 126 may be formed with a sputtering method, using silicon nitride.

In addition, in part of a region other than a display portion, where light from the light-emitting element is not extracted, a metal film or the like which has a non-light-transmitting property may be used for the protective film 126.

The protective film 126 may be formed to have a single layer structure or a stacked structure. For example, the light-emitting panel 150 may be covered with an organic resin layer and further an inorganic film may be stacked thereover to cover the organic resin layer. There is no particular limitation on the material and the formation method of the protective film as long as it is a dense film which has an effect of preventing entry of contaminant impurities such as an organic substance, a metal, or moisture floating in air.

Figure 15A:
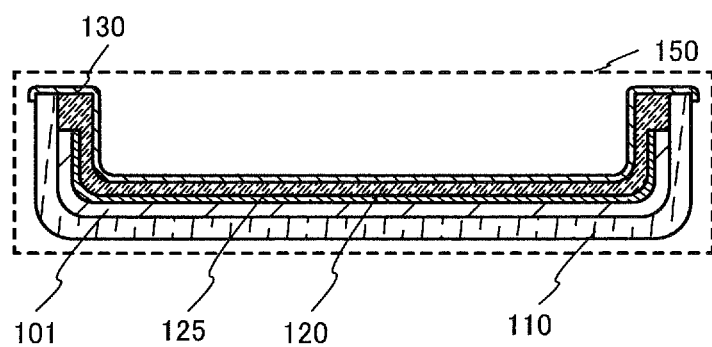
FIGS. 15A and 15B are views each illustrating a light-emitting device.

It is not always necessary that the protective film be formed to cover the entire surface of the light-emitting panel as long as it is formed to cover at least a region including a curved portion which is used as a display region. FIG. 15A illustrates an example of the curved light-emitting panel 150 in which a protective film 130 is formed on the second sealing member 120 side.

Figure 15B:
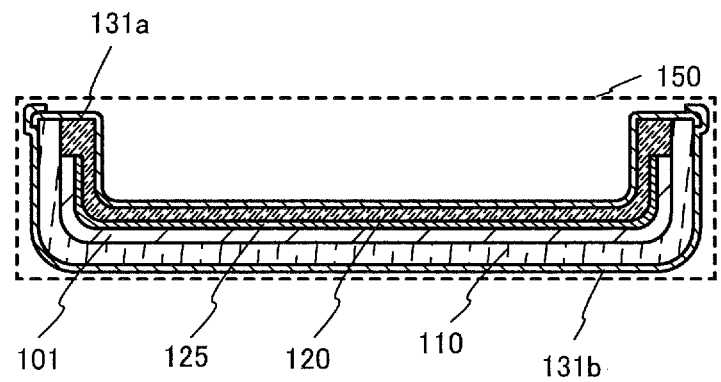

In addition, the step of forming the protective film may be performed once or plural times. FIG. 15B illustrates an example of the curved light-emitting panel 150 in which a protective film 131a is formed on the second sealing member 120 side and a protective film 131b is formed on the first sealing member 110 side. In the case where protective films are formed through a plurality of steps, the protective films may be partly stacked like the protective films 131a and 131b.

When a protective film is formed to cover an end portion of the light-emitting panel, which is not covered with a sealing member, deterioration of a light-emitting element is effectively prevented.

Although not illustrated in this embodiment, a color filter (a coloring layer); a black matrix (a light-shielding layer); an optical member (an optical substrate) such as a polarizing member, a retardation member, or an anti-reflection member; and the like are provided as appropriate. For example, circular polarization may be obtained using a polarizing substrate and a retardation substrate.

When the flexible light-emitting panel 155a is shaped into the light-emitting panel 150, fixing treatment such as heat treatment or light irradiation treatment may be performed so that the obtained shape is fixed. Alternatively, the flexible light-emitting panel 155a may be shaped into the light-emitting panel 150 by heat treatment and cooled while the obtained shape is kept as it is so that the shape of the light-emitting panel 150 is fixed.

The element layer 101 may be directly formed on the sealing member 110. For example, an electrode layer of a light-emitting element may be directly formed on the supporting substrate 102 or the first sealing member 110 with a printing method or the like.

There is no particular limitation on the method for transferring the element layer 101 from the manufacturing substrate 100 to another substrate as shown in this embodiment, and a variety of methods can be used. For example, a separation layer may be formed between the manufacturing substrate and the element layer.

With a sputtering method, a plasma CVD method, a coating method, a printing method, or the like, the separation layer is formed as a single layer or staked layers, using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy material or a compound material containing any of these elements as its main component. A layer containing silicon may have any crystalline structure: an amorphous structure; a microcrystalline structure; or a polycrystalline structure. Note that the coating method includes here a spin coating method, a droplet discharging method, and a dispensing method.

In the case where the separation layer has a single layer structure, it is preferable to form a tungsten layer, a molybdenum layer, or a layer containing a mixture of tungsten and molybdenum. Alternatively, the separation layer may be a layer containing an oxide or oxynitride of tungsten, a layer containing an oxide or oxynitride of molybdenum, or a layer containing an oxide or oxynitride of a mixture of tungsten and molybdenum. Note that the mixture of tungsten and molybdenum corresponds to an alloy of tungsten and molybdenum, for example.

In the case where the separation layer has a stacked structure, it is preferable that a tungsten layer, a molybdenum layer, or a layer containing a mixture of tungsten and molybdenum be formed as a first layer, and a layer containing an oxide, nitride, oxynitride, or nitride oxide of tungsten, molybdenum, or a mixture of tungsten and molybdenum is formed as a second layer.

In the case where the separation layer has a stacked structure of a layer containing tungsten and a layer containing an oxide of tungsten, it may be formed in such a manner that a layer containing tungsten is formed and an insulating layer containing an oxide is formed thereover, so that a layer containing an oxide of tungsten can be formed at the interface between the tungsten layer and the insulating layer. Alternatively, a surface of the layer containing tungsten may be subjected to thermal oxidation treatment, oxygen plasma treatment, treatment with a highly oxidizing solution such as ozone water, or the like, so that a layer containing an oxide of tungsten can be formed. The plasma treatment and the thermal treatment may be performed in an atmosphere of oxygen, nitrogen, or dinitrogen monoxide alone, or a mixed gas of any of these gasses and another gas. A layer containing a nitride, oxynitride, or nitride oxide of tungsten may be formed in a manner similar to that used for forming the layer containing an oxide of tungsten: after a layer containing tungsten is formed, a silicon nitride layer, a silicon oxynitride layer, or a silicon nitride oxide layer is formed thereover.

Note that the element layer can be transferred to another substrate with any of the following methods: a method in which a separation layer is formed between a substrate and an element layer, and a metal oxide film is formed between the separation layer and the element layer and then weakened by crystallization, so that the element layer is separated; a method in which an amorphous silicon film containing hydrogen is formed between a high heat-resistant substrate and an element layer and then removed by laser irradiation or etching, so that the element layer is separated; a method in which a separation layer is formed between a substrate and an element layer, a metal oxide film is formed between the separation layer and the element layer, and after the metal oxide film is weakened by crystallization and part of the separation layer is etched away using a solution or a halogen fluoride gas such as $NF_3$, $BrF_3$, or $ClF_3$, the element layer is separated at the weakened metal oxide film; and a method in which a substrate over which an element layer is formed is mechanically removed or etched away using a solution or a halogen fluoride gas such as $NF_3$, $BrF_3$, or $ClF_3$. It is also possible to use a method in which a film containing nitrogen, oxygen, hydrogen, or the like (e.g., an amorphous silicon film containing hydrogen, an alloy film containing hydrogen, or an alloy film containing oxygen) is formed as a separation layer, and the separation layer is irradiated with laser light so that nitrogen, oxygen, hydrogen, or the like contained in the separation layer is released as gas to promote separation between the element layer and the substrate.

A combination of the above separation methods further facilitates the transferring step. That is, laser irradiation, etching of a separation layer with a gas or a solution, mechanical removal of a separation layer with a sharp knife, scalpel, or the like may be performed, so that the element layer can be easily separated from the substrate, and then, the separation step can be achieved by physical force (with a machine or the like).

Alternatively, the interface between the separation layer and the element layer may be soaked with a liquid (e.g., water), whereby the element layer is separated from the substrate.

The shape of the light-emitting panel 150 can be freely determined by selecting the shape of the support which serves as a mold and the supporting member. Accordingly, it is possible to manufacture various kinds of light-emitting devices capable of being used in a variety of places for a variety of applications, which allows a highly convenient light-emitting device to be provided.

In addition, the protective film can prevent the element layer and the light-emitting element from contamination caused by impurities and thus can increase the reliability of the light-emitting device.

Embodiment 2

In this embodiment, another example of a method for manufacturing a light-emitting device, which is different from that shown in Embodiment 1, will be described with reference to FIGS. 2A to 2E. Therefore, the light-emitting device of this embodiment, except a different part, can be manufactured in a manner similar to that shown in Embodiment 1; thus, description of the same components or components having the same functions as Embodiment 1, and the manufacturing process thereof will be omitted.

FIGS. 2A to 2E are cross-sectional views illustrating a light-emitting device and a method for manufacturing the light-emitting device.

In this embodiment, a light-emitting panel is manufactured which is at least partly curved by processing the shape to be molded after the manufacture of an electrode layer and/or an element layer, and a protective film covering a surface of the light-emitting panel which is at least partly curved is formed, so that a light-emitting device using the light-emitting panel has a more useful function and higher reliability.

Figure 2A:
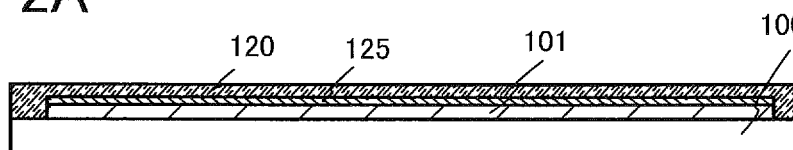
FIGS. 2A to 2E are views illustrating a method for manufacturing a light-emitting device.
Figure 2B:
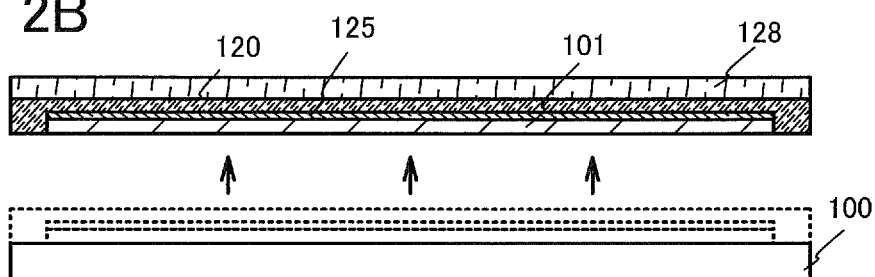

The element layer 101 and the light-emitting element 125 electrically connected to the element layer 101 are formed over the manufacturing substrate 100, and the second sealing member 120 covering the element layer 101 and the light-emitting element 125 is formed (see FIG. 2A). The element layer 101 includes a thin film transistor. Next, the element layer 101, the light-emitting element 125, and the second sealing member 120 are transferred to the third sealing member 128 (see FIG. 2B).

Figure 2C:
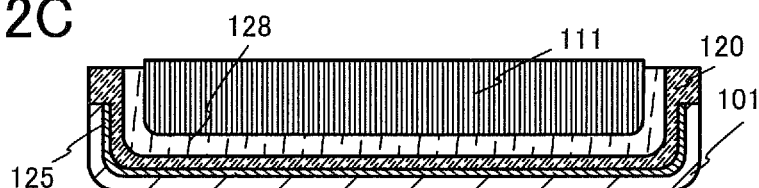

The element layer 101, the light-emitting element 125, the second sealing member 120, and the third sealing member 128 are provided along the curved surface of a curved portion of a support 111 serving as a mold for the light-emitting device so that the third sealing member 128 is in contact with the support 111 (see FIG. 2C). The third sealing member 128 may be fixed to the support 111 with an adhesive layer or the like.

Figure 2D:
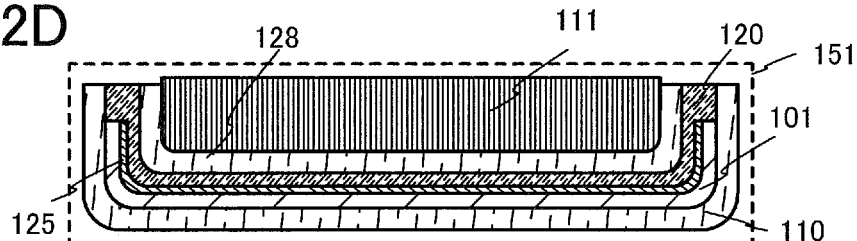

The first sealing member 110 is attached to the exposed element layer 101 side to form a curved light-emitting panel 151 (see FIG. 2D).

When the element layer 101, the light-emitting element 125, the second sealing member 120, the third sealing member 128, and the first sealing member 110 are shaped, they may be subjected to fixing treatment such as heat treatment or light irradiation treatment so that the obtained shape is fixed. Alternatively, the element layer 101, the light-emitting element 125, the second sealing member 120, the third sealing member 128, and the first sealing member 110 may be shaped by heat treatment and cooled while the obtained shape is kept as it is, so that the shape thereof is fixed.

After the light-emitting panel 151 which is curved by shaping is formed, the support 111 is removed from the curved light-emitting panel 151.

Figure 2E:
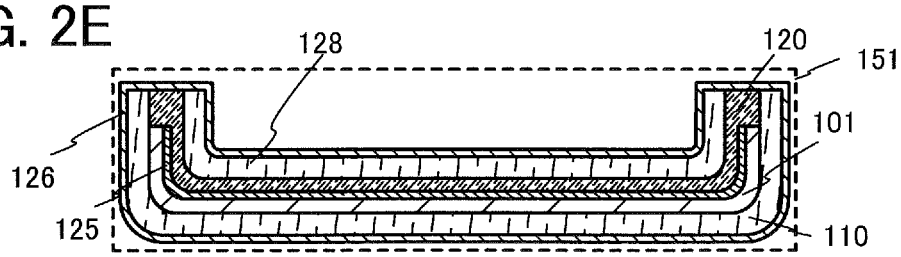

The protective film 126 is formed to cover the curved light-emitting panel 151 in a manner similar to that of Embodiment 1 (see FIG. 2E). Through the above steps, a light-emitting device including the curved light-emitting panel 151 can be manufactured.

FIGS. 2A to 2E illustrate an example in which a step of shaping the third sealing member 128 after the element layer 101, the light-emitting element 125, and the second sealing member 120 are attached to the third sealing member 128 is performed so that the element layer 101, the light-emitting element 125, and the second sealing member 120 are curved by the support 111. FIGS. 13A to 13E illustrate an example in which the element layer 101, the light-emitting element 125, and the second sealing member 120 are attached to a sealing member which is shaped to be curved.

The element layer 101 and the light-emitting element 125 electrically connected to the element layer 101 is formed over the manufacturing substrate 100, and the second sealing member 120 covering the element layer 101 and the light-emitting element 125 is formed (see FIG. 13A). Next, the element layer 101, the light-emitting element 125, and the second sealing member 120 are transferred to the supporting substrate 102 (see FIG. 13B).

The first sealing member 110 is provided along the curved surface of the curved portion of the support 111 serving as a mold for the light-emitting device. The first sealing member 110 may be fixed to the support 111 with an adhesive layer or the like.

The supporting substrate 102 and the support 111 are arranged so that the element layer 101 faces the first sealing member 110, and then, the element layer 101, the light-emitting element 125, and the second sealing member 120 are transferred to the first sealing member 110 side in a direction indicated by arrows so that the element layer 101 is in contact with the first sealing member 110 (see FIG. 13C).

The third sealing member 128 is attached to the exposed second sealing member 120 side to form a curved light-emitting panel 152 (see FIG. 13D).

The protective film 126 is formed to cover the curved light-emitting panel 152 (see FIG. 13E). Through the above steps, a light-emitting device including the curved light-emitting panel 152 can be manufactured.

In manufactured light-emitting panels, the direction of curves which is determined by the order of performing a shaping step to shape the light-emitting panel can differ like the light-emitting panel 151 and the light-emitting panel 152. In addition, a light-emitting panel which reflects the shape of the support 111 can be manufactured by selecting the shape of the support 111.

The shape of the light-emitting panel can be freely determined by selecting the shape of the support which serves as a mold and the supporting member. Accordingly, it is possible to manufacture various kinds of light-emitting devices capable of being used in a variety of places for a variety of applications, which allows a highly convenient light-emitting device to be provided.

In addition, the protective film can prevent the element layer and the light-emitting element from contamination caused by impurities and thus can increase the reliability of the light-emitting device.

Embodiment 3

In this embodiment, an example of a light-emitting device in Embodiment 1 or Embodiment 2, which uses a supporting member, will be described with reference to FIGS. 3A to 3C and FIGS. 4A to 4C. Therefore, the light-emitting device of this embodiment, except a different part, can be manufactured in a manner similar to that shown in Embodiment 1 or Embodiment 2; thus, description of the same components or components having the same functions as Embodiment 1 or Embodiment 2, and the manufacturing process thereof will be omitted.

FIGS. 3A to 3C and FIGS. 4A to 4C illustrate the light-emitting device of this embodiment.

In a manufacturing process of a light-emitting device in this embodiment, the shape of a light-emitting panel is processed to be molded after the manufacture of an electrode layer and/or an element layer, so that a light-emitting device using the light-emitting panel has a more useful function. Furthermore, the provision of a protective film increases the reliability of the light-emitting device. Note that in this embodiment, a supporting member is used to maintain the shape of the light-emitting device whose shape is at least partly curved.

Figure 3A:
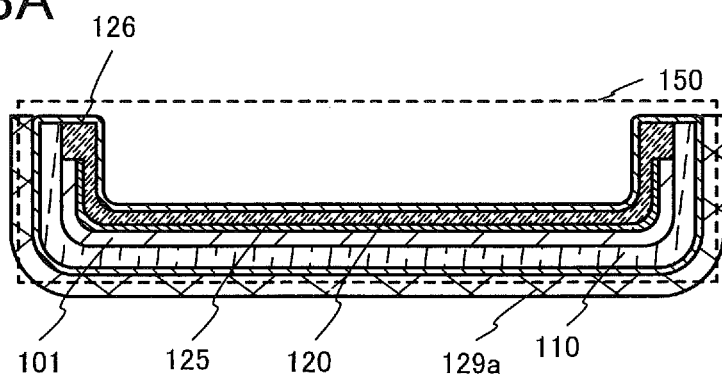
FIGS. 3A to 3C are views illustrating a light-emitting device.
Figure 3B:
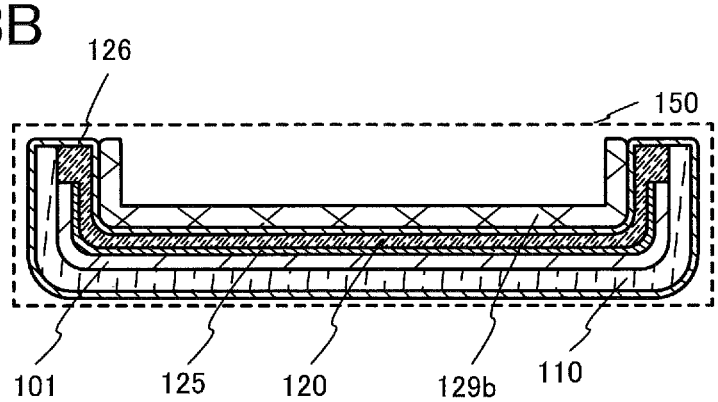
Figure 3C:
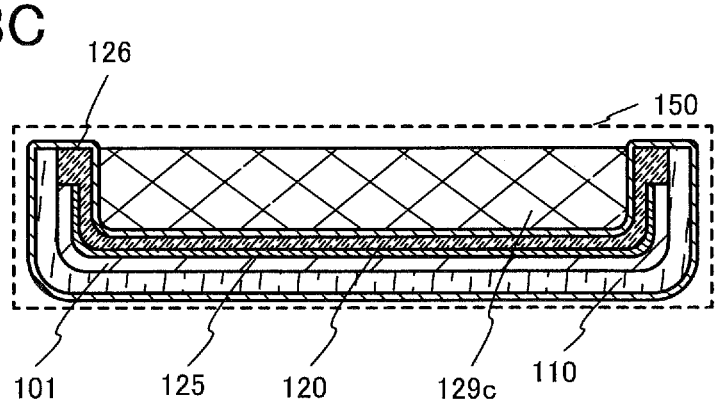

In an example of the light-emitting device illustrated in FIGS. 3A to 3C, the shape of the curved light-emitting panel 150 in which the element layer 101 and the light-emitting element 125 are sealed between the first sealing member 110 and the second sealing member 120 and which is covered with the protective film 126 is fixed (maintained) by attachment of a supporting member to the light-emitting panel 150. Note that light in the light-emitting panel 150 passes through the first sealing member 110 and is emitted to a viewer side.

In FIG. 3A, a supporting member 129a is provided for the light-emitting panel 150 so as to be in contact with the protective film 126 outside the curved portion (on the first sealing member 110 side). In FIG. 3B, a supporting member 129b is provided for the light-emitting panel 150 so as to be in contact with the protective film 126 inside the curved portion (on the second sealing member 120 side). In FIG. 3C, a supporting member 129c is provided for the light-emitting panel 150 in contact with the protective film 126 so as to fill inside of the curved portion (on the second sealing member 120 side).

The supporting members 129a, 129b, and 129c may be fixed to the protective film 126 with an adhesive layer. In addition, in the case where the supporting member is provided so as to fill inside of the curved portion of the light-emitting panel like the supporting member 129c, a light curable resin, a thermosetting resin, or the like which is used for a sealant may be used to attach the supporting member 129c to the light-emitting panel 150 so that the shape of the light-emitting panel 150 is retained.

In the case where the supporting members 129a, 129b, and 129c are provided on the display side from which light of the light-emitting panel 150 is extracted, a light-transmitting material is used. Thus, in the case where light in the light-emitting panel 150 passes through the first sealing member 110 and is emitted to a viewer side, a light-transmitting supporting member is used as the supporting member 129a of FIG. 3A, whereas the supporting members 129b and 129c of FIGS. 3B and 3C do not need to have a light-transmitting property, and when a reflective material is used, efficiency in extracting light from the light-emitting panel 150 is effectively improved. With a structure of the light-emitting panel 150, in which light is extracted from both the first sealing member 110 and the second sealing member 120, the supporting members 129a, 129b, and 129c need to have a light-transmitting property.

Figure 4A:
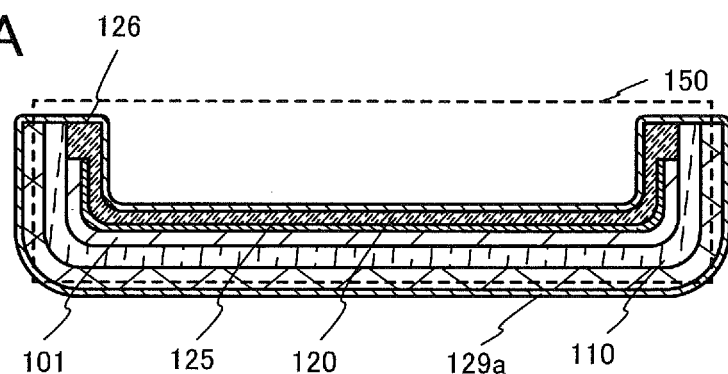
FIGS. 4A to 4C are views illustrating a light-emitting device.
Figure 4B:
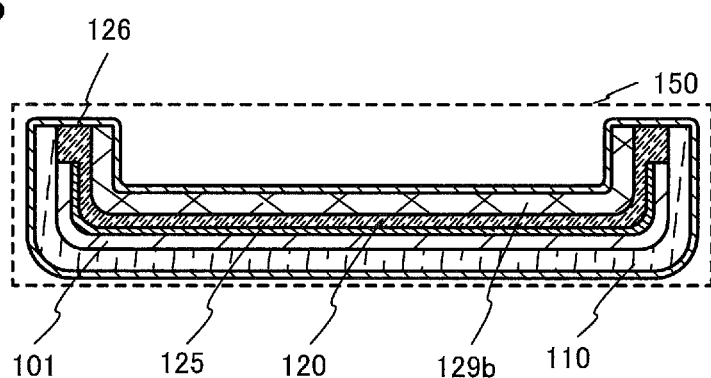
Figure 4C:
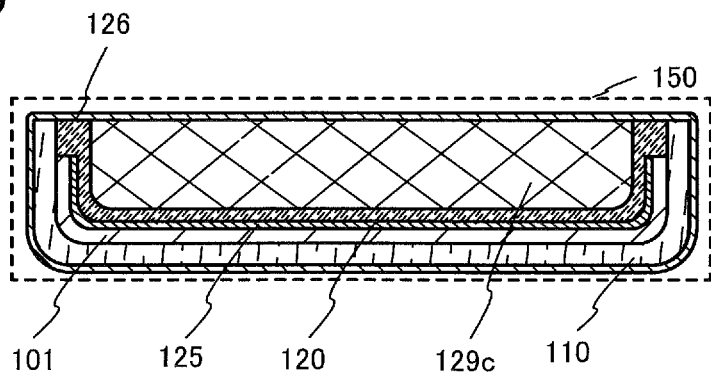

Although examples in each of which the supporting member is provided for the light-emitting panel 150 covered with the protective film 126 are illustrated in FIGS. 3A to 3C, the protective film may be formed so as to cover the surfaces of the light-emitting panel and the supporting member after the supporting member is provided for the light-emitting panel as illustrated in FIGS. 4A to 4C.

The shape of the light-emitting panel 150 can be freely determined by selecting the shape of the support which serves as a mold and the supporting member. Accordingly, it is possible to manufacture various kinds of light-emitting devices capable of being used in a variety of places for a variety of applications, which allows a highly convenient light-emitting device to be provided.

In addition, the protective film can prevent the element layer and the light-emitting element from contamination caused by impurities and thus can increase the reliability of the light-emitting device.

Embodiment 4

In this embodiment, an example in which a plurality of element layers for the light-emitting devices shown in Embodiments 1 to 3 are manufactured over a large substrate (a so-called multi-panel technology) will be described with reference to FIGS. 7A to 7F. Therefore, the light-emitting device of this embodiment, except a different part, can be manufactured in a manner similar to that shown in Embodiments 1 to 3; thus, description of the same components or components having the same functions as Embodiments 1 to 3, and the manufacturing process thereof will be omitted.

As described in the above embodiments, the element layer 101 is formed over the manufacturing substrate 100 and then the element layer 101 is transferred from the manufacturing substrate 100 to the supporting substrate 102 that is a flexible substrate.

Figure 7A:
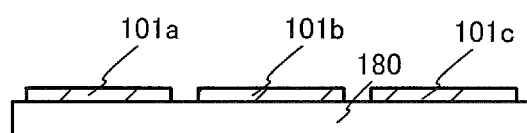
FIGS. 7A to 7F are views illustrating a method for manufacturing a light-emitting device.
Figure 7B:
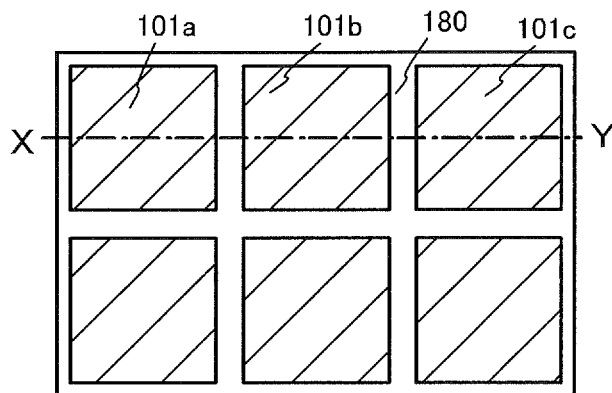
Figure 7C:
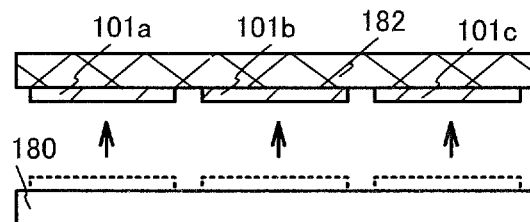
Figure 7D:
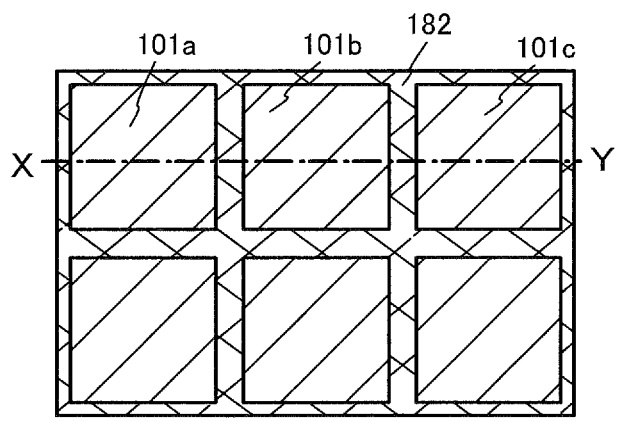
Figure 7E:
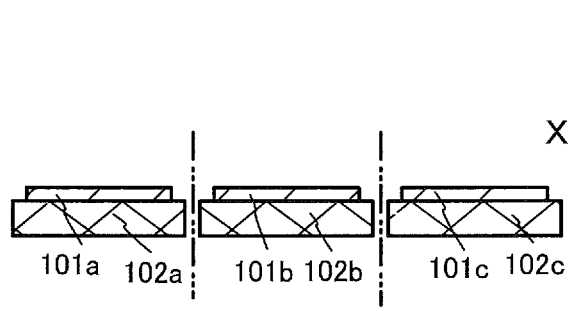
Figure 7F:
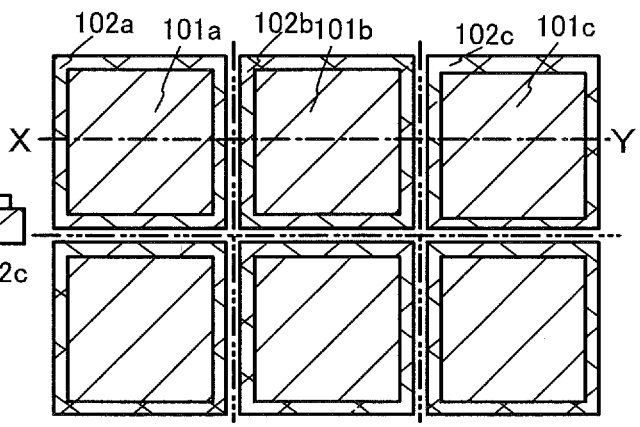

FIGS. 7A to 7F illustrate a method for transferring a plurality of element layers from a large manufacturing substrate to a supporting substrate and the supporting substrate is divided into a plurality of supporting substrates. FIGS. 7B, 7D, and 7F are plan views, and FIGS. 7A, 7C, and 7E are cross-sectional views taken along line X-Y of FIGS. 7B, 7D, and 7F, respectively.

Element layers 101a, 101b, and 101c are formed over a large manufacturing substrate 180 (see FIGS. 7A and 7B).

A supporting substrate 182 with the same size as the manufacturing substrate 180 is arranged so as to face the element layers 101a, 101b, and 101c, and the element layers 101a, 101b, and 101c are transferred from the manufacturing substrate 180 to the supporting substrate 182 in a direction indicated by arrows (see FIGS. 7C and 7D).

The supporting substrate 182 is divided into a supporting substrate 102a, a supporting substrate 102b, and a supporting substrate 102c for the element layer 101a, the element layer 101b, and the element layer 101c, respectively (see FIGS. 7E and 7F). There is no particular limitation on a dividing method as long as the supporting substrate can be cut off physically. For example, the supporting substrate 182 may be divided with a dicer or a scriber, or by laser irradiation.

The element layers 101 (101a, 101b, and 101c) formed over the supporting substrates 102 (102a, 102b, and 102c), respectively, for panels are used for manufacturing light-emitting devices. The subsequent steps may be performed in a manner similar to those shown in Embodiments 1 to 3.

Such a step of simultaneously transferring a plurality of element layers with the use of a large substrate allows a plurality of light-emitting devices to be provided at a higher productivity.

Embodiment 5

The invention disclosed in this specification can be applied to a passive matrix light-emitting device as well as an active matrix light-emitting device.

Thin film transistors are manufactured and used for a pixel portion and further a driver circuit, so that a light-emitting device having a display function can be manufactured. In addition, when part or whole of the driver circuit is formed over the same substrate as the pixel portion with the use of the thin film transistors, a system-on-panel can be obtained.

The light-emitting device includes a light-emitting element (also referred to as an EL element) as a display element.

Furthermore, the light-emitting device includes a panel in which the display element is sealed, and a module in which an IC or the like including a controller is mounted on the panel. In this embodiment, light-emitting device modules will be illustrated in FIGS. 6A and 6B, FIG. 8, and FIGS. 14A to 14C.

Note that a light-emitting device in this specification refers to an image display device, a display device, or a light source (including a lighting device). Furthermore, the light-emitting device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element with a chip on glass (COG) method.

Figure 6A:
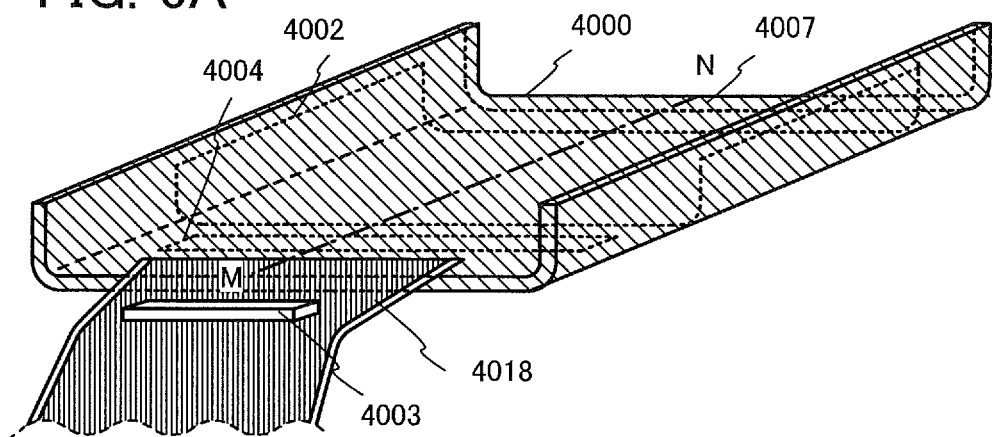
FIGS. 6A and 6B are views each illustrating a light-emitting module.
Figure 6B:
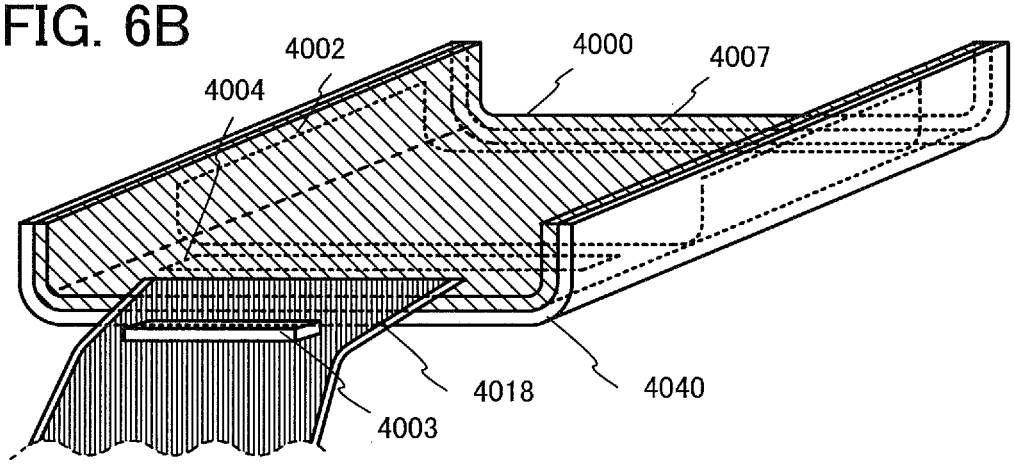
Figure 8:
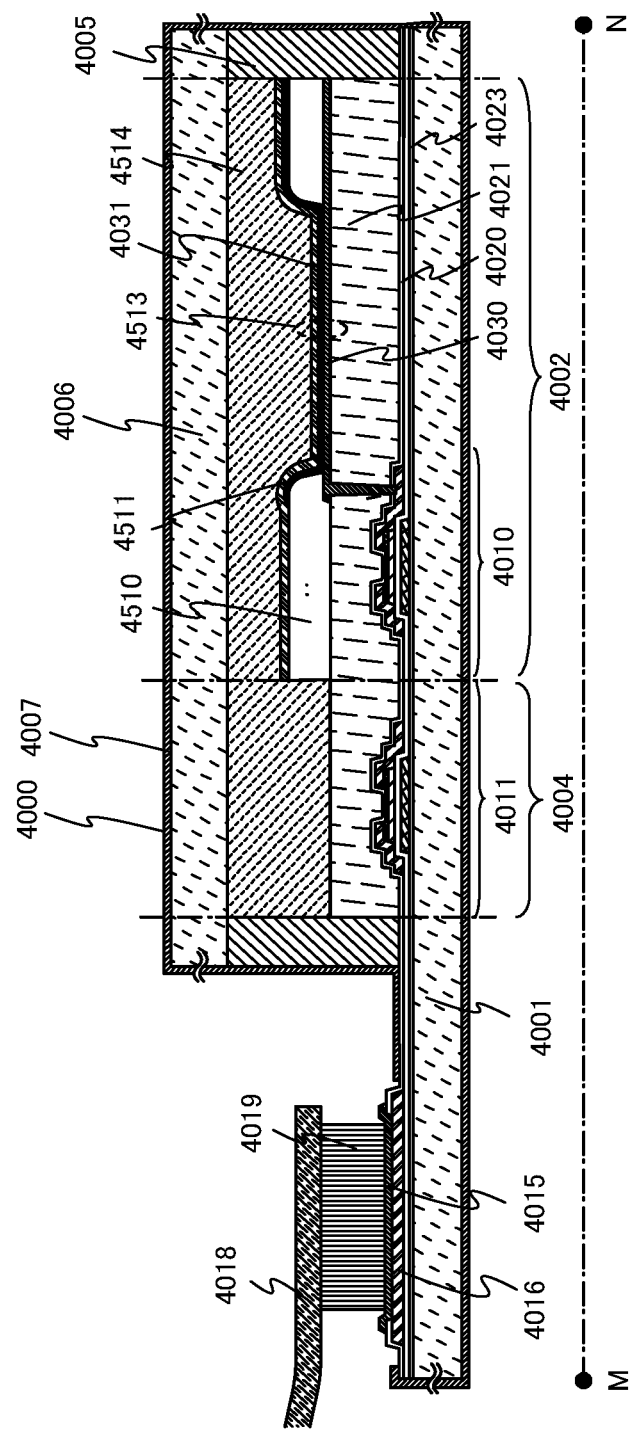
FIG. 8 is a view illustrating a light-emitting module.
Figure 9A:
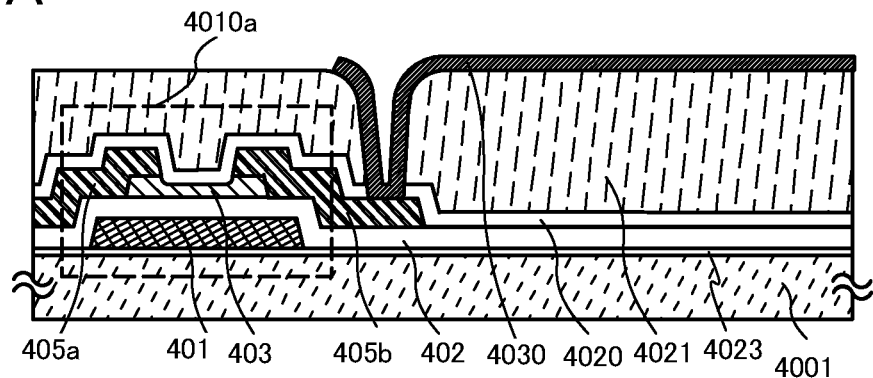
FIGS. 9A to 9D are views each illustrating a semiconductor element that can be applied to a light-emitting device.
Figure 9B:
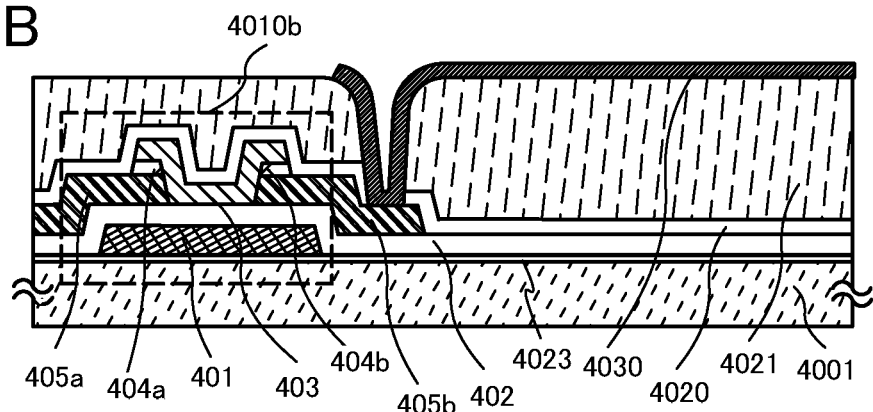
Figure 9C:
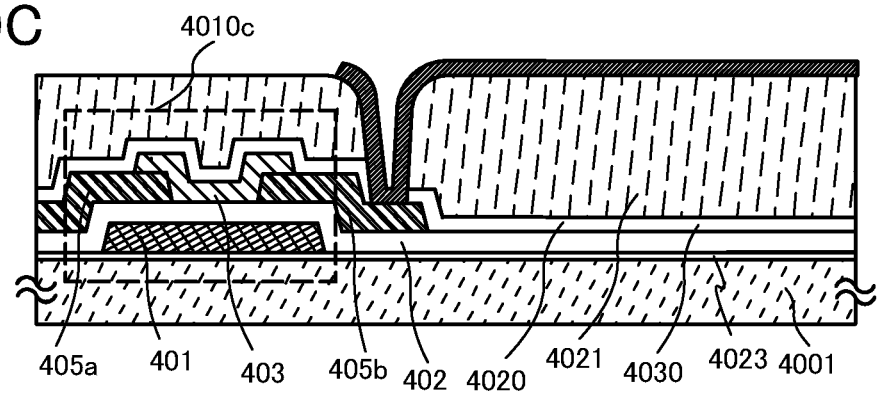
Figure 9D:
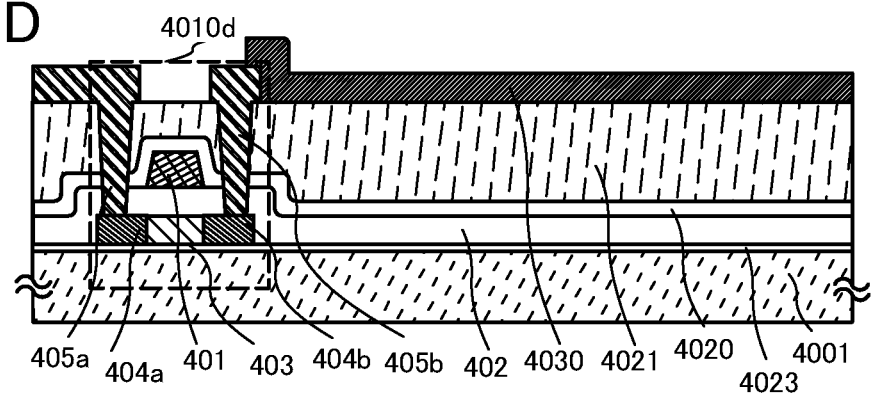

The appearance and cross section of a light-emitting panel (also referred to as a light-emitting display panel) which is one embodiment of the light-emitting device will be described with reference to FIGS. 6A and 6B, FIG. 8, and FIGS. 14A to 14C. FIGS. 6A and 6B, FIG. 8, and FIGS. 14A to 14C are examples of a light-emitting module (also referred to as a light-emitting display module) in which an FPC 4018 is attached to a light-emitting panel 4000. Thin film transistors 4010 and 4011 and a light-emitting element 4513 which are formed over a first sealing member 4001 are sealed between the first sealing member 4001 and a third sealing member 4006 with a sealant 4005. FIGS. 6A and 6B are perspective views of the light-emitting modules, and FIG. 8 is a cross-sectional view taken along line M-N of FIG. 6A. An element layer and the light-emitting element are sealed with the first sealing member 4001 and the third sealing member 4006 so as to be interposed therebetween. The surface of the light-emitting panel 4000 is covered with a protective film 4007, and the protective film 4007 has an opening in a region connected to the FPC 4018.

The light-emitting module of FIG. 6B illustrates an example in which the light-emitting panel 4000 is fixed to a light-transmitting supporting member 4040. The light-emitting panel 4000 is provided in contact with an inner surface of the light-transmitting supporting member 4040.

As illustrated in each of FIGS. 6A and 6B, a pixel portion 4002 which functions as a display area is continuously provided on the side surfaces and bottom surface of the light-emitting panel that is curved, so that a first display area can be provided on the bottom surface and a second display area can be provided on the side surfaces.

Figure 14A:
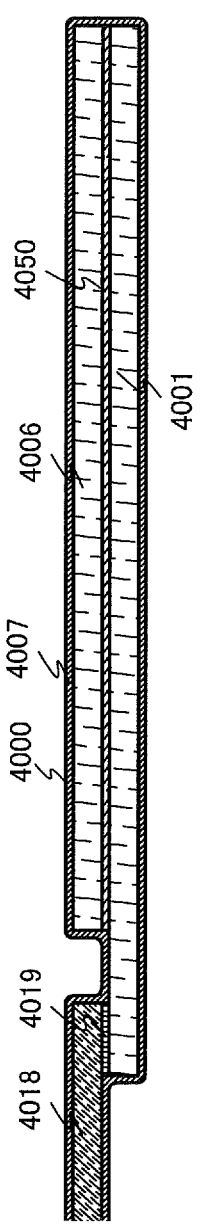
FIGS. 14A to 14C are views each illustrating a light-emitting module.
Figure 14B:
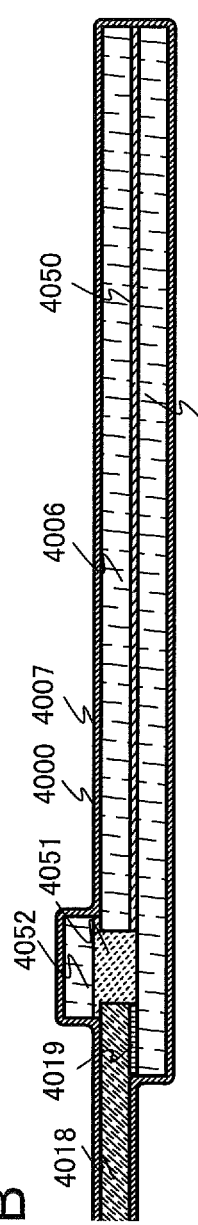
Figure 14C:
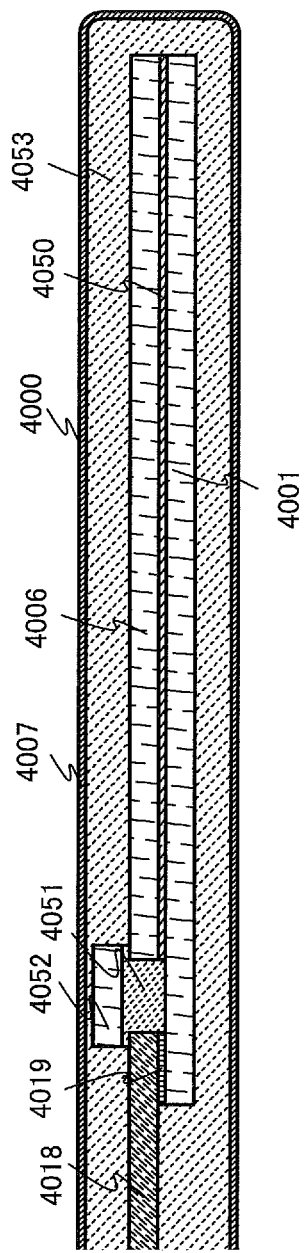

FIGS. 14A to 14C are other examples of the light-emitting module, each of which has a structure in which the protective film 4007 is provided after the FPC 4018 is mounted on the light-emitting panel 4000. In FIGS. 14A to 14C, an element portion 4050 denotes the element layer and the light-emitting element. FIG. 14A illustrates a structure in which the FPC 4018 which is electrically connected to the first sealing member 4001, the element portion 4050, and the third sealing member 4006 is mounted on the light-emitting panel 4000 with an anisotropic conductive film 4019 and then the light-emitting panel 4000 and the FPC 4018 are all covered with the protective film 4007.

In FIG. 14B, an adhesive layer 4051 is formed so as to fill a region where the first sealing member 4001 and the third sealing member 4006 are not stacked, and a sealing member 4052 is attached to the adhesive layer 4051. The physical strength of the light-emitting panel 4000 can be improved by provision of the sealing member 4052. FIG. 14B illustrates a structure in which the light-emitting panel 4000, the sealing member 4052, and the FPC 4018 are all covered with the protective film 4007.

In FIG. 14C, in a manner similar to that of FIG. 14B, the adhesive layer 4051 is formed so as to fill a region where the first sealing member 4001 and the third sealing member 4006 are not stacked, and the sealing member 4052 is attached to the adhesive layer 4051. Further, a resin layer 4053 which covers the light-emitting panel 4000, the sealing member 4052, and the FPC 4018 is formed to planarize the surfaces thereof. FIG. 14C illustrates a structure in which the protective film 4007 is formed so as to cover the surfaces which are planarized by the resin layer 4053.

The sealant 4005 is provided to surround the pixel portion 4002 and a scan line driver circuit 4004 which are provided over the first sealing member 4001. The third sealing member 4006 is provided over the pixel portion 4002 and the scan line driver circuit 4004. Therefore, the pixel portion 4002 and the scan line driver circuit 4004 are sealed together with the light-emitting element 4513 by the first sealing member 4001, the sealant 4005, and the third sealing member 4006.

A signal line driver circuit 4003 is formed using a single crystal semiconductor film or a polycrystalline semiconductor film over a substrate separately prepared, and is mounted by TAB in a region different from the region surrounded by the sealant.

Further, a variety of signals and potentials are supplied from the FPC 4018 to the signal line driver circuit 4003 that is formed separately, and the scan line driver circuit 4004 or the pixel portion 4002.

In FIG. 8, a connection terminal electrode 4015 is formed using the same conductive film as a first pixel electrode layer 4030, and a terminal electrode 4016 is formed using the same conductive film as source and drain electrode layers of the thin film transistors 4010 and 4011.

The connection terminal electrode 4015 is electrically connected to a terminal included in the FPC 4018 via the anisotropic conductive film 4019.

Note that there is no particular limitation on the connection method of the driver circuit separately formed, and a COG method, a wire bonding method, a TAB method, or the like can be used.

The pixel portion 4002 and the scan line driver circuit 4004 which are provided over the first sealing member 4001 include a plurality of thin film transistors. FIG. 8 illustrates the thin film transistor 4010 included in the pixel portion 4002 and the thin film transistor 4011 included in the scan line driver circuit 4004, for example. Insulating layers 4020 and 4021 are provided over the thin film transistors 4010 and 4011. Note that an insulating film 4023 is an insulating film which functions as a base film.

Various kinds of thin film transistors can be applied to the thin film transistors 4010 and 4011 without particular limitation. FIG. 8 illustrates an example in which inverted-staggered thin film transistors having a bottom-gate structure are used as the thin film transistors 4010 and 4011. Although the thin film transistors 4010 and 4011 are channel-etched thin film transistors, they may be channel-protective inverted-staggered thin film transistors in which a channel protective film is provided over a semiconductor layer.

Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, voltage is applied to a light-emitting element, whereby electrons and holes are separately injected from a pair of electrodes into a layer containing a light-emitting organic compound, and thus current flows. The carriers (electrons and holes) are recombined, and thus, the light-emitting organic compound is excited. The light-emitting organic compound returns to a ground state from the excited state, thereby emitting light. By such a mechanism, such a light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

In order to extract light emission from the light-emitting element, at least one of a pair of electrodes is transparent. Then, a thin film transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be applied.

The light emitting element 4513 illustrated in FIG. 8 is electrically connected to the thin film transistor 4010 which is provided for the pixel portion 4002. Note that in the structure of the light-emitting element 4513, the first electrode layer 4030, an electroluminescent layer (EL layer) 4511, and a second electrode layer 4031 are stacked; however, the structure of the light-emitting element 4513 is not limited to the structure described in this embodiment. The structure of the light-emitting element 4513 can be changed as appropriate, depending on the direction in which light is extracted from the light-emitting element 4513, for example.

A partition 4510 is formed using an organic resin film, an inorganic insulating film, or an organic polysiloxane film. It is particularly preferable that the partition 4510 be formed using a photosensitive material to have an opening portion over the first electrode layer 4030 so that a sidewall of the opening portion is formed as a tilted surface with continuous curvature.

The electroluminescent layer 4511 may be formed using either a single layer or a plurality of layers stacked.

In order to prevent entry of oxygen, hydrogen, moisture, carbon dioxide, or the like into the light-emitting element 4513, a protective film may be formed over the second electrode layer 4031 and the partition 4510. As the protective film, a silicon nitride film, a silicon nitride oxide film, a DLC film, or the like can be formed. In addition, a space which is sealed using the first sealing member 4001, the third sealing member 4006, and the sealant 4005 is hermetically sealed with a second sealing member 4514 which functions as a filling member. In this manner, it is preferable that the light-emitting element be packaged (sealed) with a protective film (such as a laminate film or an ultraviolet curable resin film) or a cover material with high air-tightness and little degasification so that the light-emitting element is not exposed to the outside air.

An ultraviolet curable resin or a thermosetting resin can be used for the second sealing member 4514. For example, polyvinyl chloride (PVC), acrylic, polyimide, an epoxy resin, a silicone resin, polyvinyl butyral (PVB), or ethylene vinyl acetate (EVA) can be used. Instead of the second sealing member 4514, an inert gas such as nitrogen or argon can be used as the filler. For example, nitrogen is used as the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

When a material which exhibits monochromatic light is formed and combined with color filters or color conversion layers, full color display can be performed. Needless to say, display of monochromatic light can also be performed.

A color conversion layer or a coloring layer which functions as a color filter may be attached to the light-emitting panel so as to correspond to each pixel after the light-emitting element is sealed between the sealing members and the light-emitting panel is formed. Alternatively, the sealing may be performed together with the light-emitting element between the sealing members. In the case where a coloring layer is provided between the sealing members, there is no particular limitation on the stack order of the coloring layer, the element layer, and the light-emitting element, and the following stack order may be given: the first sealing member, the coloring layer, the element layer, the light-emitting element, and the second sealing member; the first sealing member, the element layer, the coloring member, the light-emitting element, and the second sealing member; and the first sealing member, the element layer, the light-emitting element, the coloring layer, and the second sealing member. The position of the coloring layer may be anywhere as long as the light emitted from the light-emitting element passes through it before the light is emitted outside.

Emission wavelength range of the light-emitting layer included in the electroluminescent layer 4511 may vary by pixels so that color display can be performed. Typically, light-emitting layers corresponding to R (Red), G (Green), and B (Blue) are formed. In addition, white light emission may be combined. Also in this case, color purity can be improved and a pixel region can be prevented from having a mirror surface (reflection) by provision of a filter which transmits light of the emission wavelength range on the light-emission side of the pixel.

Note that plastic or the like can be used for the first sealing member 4001 and the third sealing member 4006. A plastic substrate may be a fiberglass-reinforced plastics (FRP) plate, a polyvinyl fluoride (PVF) film, a polyester film, or an acrylic resin film. Alternatively, a sheet with a structure in which an aluminum foil is sandwiched between PVF films or polyester films can be used. In the case where there is no necessity of a light-transmitting property, a metal film such as stainless steel may be used.

The insulating layer 4020 functions as a protective film of the thin film transistors.

Note that the protective film is provided to prevent entry of contaminant impurities such as organic substance, a metal, or moisture floating in air and is preferably a dense film. The protective film may be formed with a sputtering method as a single layer or stacked layers of a silicon oxide film, a silicon nitride film, a silicon oxynitride film, a silicon nitride oxide film, an aluminum oxide film, an aluminum nitride film, aluminum oxynitride film, and/or an aluminum nitride oxide film.

The insulating layer 4021 which functions as a planarizing insulating film can be formed using an organic material having heat resistance, such as polyimide, an acrylic resin, a benzocyclobutene-based resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using these materials.

There is no particular limitation on the method for forming the insulating layer 4020 and the insulating layer 4021, and any of the following methods which depend on a material thereof can be used: a sputtering method; a CVD method; an evaporation method; a SOG method; spin coating; dipping; spray coating; a droplet discharging method (e.g., an ink-jet method, screen printing, or offset printing). Alternatively, doctor knife, roll coater, curtain coater, knife coater, or the like can be used for forming the insulating layer 4020 and the insulating layer 4021. In the case where the insulating layers are formed using a material solution, the semiconductor layer may be annealed (at 200° C. to 400° C.) simultaneously with a baking step. The baking step of the insulating layers also serves as the annealing step of the semiconductor layer, whereby a light-emitting device can be manufactured efficiently.

Display of the light-emitting panel is performed using light transmitted through the light-emitting element. Therefore, the sealing members and thin films such as insulating films and conductive films, which are provided in a display portion (a light-emitting portion) through which light passes, all have light-transmitting properties with respect to light in a visible wavelength range.

The first electrode layer and the second electrode layer (also referred to as a pixel electrode layer and a counter electrode layer, respectively, for example) for applying voltage to the light-emitting element may have light-transmitting properties or light-reflecting properties, and which property is selected may be determined by the direction in which light is extracted, the place where the electrode layers are provided, or the pattern structure of the electrode layers.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), or an alloy or a metal nitride thereof.

A conductive composition containing a conductive macromolecule (also referred to as a conductive polymer) can be used to form the first electrode layer 4030 and the second electrode layer 4031. As the conductive macromolecule, a so-called π-electron conjugated conductive macromolecule can be used. For example, it is possible to use polyaniline or a derivative thereof, polypyrrole or a derivative thereof, polythiophene or a derivative thereof, or a copolymer of two or more kinds of them.

Since the thin film transistors are easily damaged by static electricity or the like, a protective circuit for protecting the driver circuits is preferably provided over the same substrate (the sealing member) as a gate line or a source line. It is preferable to use a non-linear element for the protective circuit.

FIG. 8 illustrates an example in which the signal line driver circuit is formed separately and mounted on the first sealing member 4001; however, this embodiment is not limited to this structure. The scan line driver circuit may be separately formed and then mounted, or only part of the signal line driver circuit or part of the scan line driver circuit may be separately formed and then mounted.

This embodiment can be implemented in an appropriate combination with the structures described in the other embodiments.

Embodiment 6

There is no particular limitation on the kind of thin film transistor included in the light-emitting device disclosed in this specification. Therefore, a variety of structures and semiconductor materials can be used for the thin film transistor.

Examples of the structure of the thin film transistor will be described with reference to FIGS. 9A to 9D. FIGS. 9A to 9D illustrate examples of the thin film transistor which can be used for the thin film transistor 4010 in Embodiment 5, and FIGS. 9A to 9D correspond to FIG. 8.

In FIGS. 9A, 9B, 9C, and 9D, thin film transistors 4010a, 4010b, 4010c, and 4010d are respectively provided. Each of the thin film transistors 4010a, 4010b, 4010c, and 4010d is provided over the insulating film 4023, which is formed over the first sealing member 4001. The insulating layer 4020 and the insulating layer 4021 are formed over each of the thin film transistors 4010a, 4010b, 4010c, and 4010d, and the first electrode layer 4030 which is electrically connected to each of the thin film transistors 4010a, 4010b, 4010c, and 4010d is provided thereover.

The thin film transistor 4010a is an example of the thin film transistor 4010 illustrated in FIG. 8, in which wiring layers 405a and 405b which function as source and drain electrode layers are in contact with a semiconductor layer 403 without an $n^+$ layer interposed therebetween.

The thin film transistor 4010a is an inverted-staggered thin film transistor, in which a gate electrode layer 401, a gate insulating layer 402, the semiconductor layer 403, and the wiring layers 405a and 405b serving as source and drain electrode layers are provided over the first sealing member 4001 which is a substrate having an insulating surface and over the insulating film 4023.

The thin film transistor 4010b is a bottom-gate thin film transistor, in which the gate electrode layer 401, the gate insulating layer 402, the wiring layers 405a and 405b which function as source and drain electrode layers, $n^+$ layers 404a and 404b which function as source and drain regions, and the semiconductor layer 403 are provided over the first sealing member 4001 which is a substrate having an insulating surface and over the insulating film 4023. In addition, the insulating layer 4020 is provided in contact with the semiconductor layer 403 so as to cover the thin film transistor 4010b.

The $n^+$ layers 404a and 404b may be provided between the gate insulating layer 402 and the wiring layers 405a and 405b. Alternatively, the n+ layers may be provided both between the gate insulating layer and the wiring layers and between the wiring layers and the semiconductor layer. The n+ layers 404a and 404b are semiconductor layers each having a lower resistance than the semiconductor layer 403.

The gate insulating layer 402 exists in the entire region including the thin film transistor 4010b, and the gate electrode layer 401 is provided between the gate insulating layer 402 and the first sealing member 4001 which is a substrate having an insulating surface. The wiring layers 405a and 405b and the n+ layers 404a and 404b are provided over the gate insulating layer 402. Then, the semiconductor layer 403 is provided over the gate insulating layer 402, the wiring layers 405a and 405b, and the n+ layers 404a and 404b. Although not illustrated, another wiring layer is provided over the gate insulating layer 402 in addition to the wiring layers 405a and 405b, and the wiring layer extends beyond the perimeter of the semiconductor layer 403 to the outside.

The thin film transistor 4010c has another structure of the thin film transistor 4010b, in which source and drain electrode layers are in contact with a semiconductor layer without an n+ layer interposed therebetween.

The gate insulating layer 402 exists in the entire region including the thin film transistor 4010c, and the gate electrode layer 401 is provided between the gate insulating layer 402 and the first sealing member 4001 which is a substrate having an insulating surface. The wiring layers 405a and 405b are provided over the gate insulating layer 402. Then, the semiconductor layer 403 is provided over the gate insulating layer 402 and the wiring layers 405a and 405b. Although not illustrated, another wiring layer is provided over the gate insulating layer 402 in addition to the wiring layers 405a and 405b, and the wiring layer extends beyond the perimeter of the semiconductor layer 403 to the outside.

The thin film transistor 4010d is a top-gate thin film transistor and an example of a planar thin film transistor. The semiconductor layer 403 including the n+ layers 404a and 404b which function as source and drain regions is formed over the first sealing member 4001 which is a substrate having an insulating surface and over the insulating film 4023. The gate insulating layer 402 is formed over the semiconductor layer 403, and the gate electrode layer 401 is formed over the gate insulating layer 402. In addition, the wiring layers 405a and 405b which function as source and drain electrode layers are formed in contact with the n+ layers 404a and 404b. The n+ layers 404a and 404b are semiconductor regions each having a lower resistance than the semiconductor layer 403.

The thin film transistor may be a top-gate forward-staggered thin film transistor.

Although a single gate structure is described in this embodiment, a multi-gate structure such as a double-gate structure may also be used. In that case, gate electrode layers may be provided above and below the semiconductor layer, or a plurality of gate electrode layers may be provided only on one side of (above or below) the semiconductor layer.

There is no particular limitation on the semiconductor material used for the semiconductor layer. Examples of the material which can be used for the semiconductor layer of the thin film transistor are described below.

As a material for the semiconductor layer included in the semiconductor element, it is possible to use an amorphous semiconductor (hereinafter also referred to as an AS) which is formed with a vapor-phase growth method using a semiconductor material gas typified by silane or germane or with a sputtering method; a polycrystalline semiconductor (a crystalline semiconductor) that is obtained by crystallizing the amorphous semiconductor by utilizing light energy or thermal energy; a microcrystalline semiconductor (also referred to as a semi-amorphous or microcrystal semiconductor, and hereinafter also referred to as an SAS), or the like. The semiconductor layer can be deposited with a sputtering method, an LPCVD method, a plasma CVD method, or the like.

In consideration of Gibbs free energy, the microcrystalline semiconductor film is in a metastable state that is intermediate between an amorphous state and a single crystal state. That is, the microcrystalline semiconductor is in a third state that is stable in free energy, and has short-range order and lattice distortion. Columnar or needle-like crystals grow in the direction of the normal to the surface of the substrate (the sealing member). The Raman spectrum of microcrystalline silicon which is a typical example of a microcrystalline semiconductor is shifted to a lower wavenumber side than 520 cm$^{-1}$ that represents single crystal silicon. In other words, the Raman spectrum of microcrystalline silicon has a peak between 520 cm$^{-1}$ that represents single crystal silicon and 480 cm$^{-1}$ that represents amorphous silicon. Furthermore, the microcrystalline semiconductor film contains at least 1 atomic % or more of hydrogen or halogen to terminate dangling bonds. The microcrystalline semiconductor film may further contain a rare gas element such as helium, argon, krypton, or neon to promote lattice distortion further, whereby a favorable microcrystalline semiconductor film with improved stability can be obtained.

This microcrystalline semiconductor film can be formed with a high-frequency plasma CVD method with a frequency of several tens of megahertz to several hundreds of megahertz, or a microwave plasma CVD apparatus with a frequency of 1 GHz or more. Typically, the microcrystalline semiconductor film can be formed using silicon hydride such as $SiH_4$, $Si_2H_6$, $SiH_2Cl_2$, $SiHCl_3$, $SiCl_4$, or $SiF_4$, which is diluted with hydrogen. Furthermore, the microcrystalline semiconductor film can be formed with a dilution of one or more kinds of rare gas elements selected from helium, argon, krypton, or neon, in addition to a dilution of silicon hydride and hydrogen. In such a case, the flow rate ratio of hydrogen to silicon hydride is set to 5:1 to 200:1, preferably 50:1 to 150:1, and more preferably 100:1.

The amorphous semiconductor is typified by hydrogenated amorphous silicon, and the polycrystalline semiconductor is typified by polysilicon or the like. Polysilicon (polycrystalline silicon) includes so-called high-temperature polysilicon that contains polysilicon formed at a process temperature of 800° C. or higher as its main component, so-called low-temperature polysilicon that contains polysilicon formed at a process temperature of 600° C. or lower as its main component, and polysilicon formed by crystallizing amorphous silicon, using an element that promotes crystallization, for example. It is needless to say that a microcrystalline semiconductor or a semiconductor partly including a crystalline phase can also be used as described above.

As a semiconductor material, a compound semiconductor such as GaAs, InP, SiC, ZnSe, GaN, or SiGe as well as silicon (Si) or germanium (Ge) alone can be used.

In the case of using a crystalline semiconductor film for the semiconductor layer, the crystalline semiconductor film may be manufactured by various methods (e.g., a laser crystallization method, a thermal crystallization method, or a thermal crystallization method using an element such as nickel that promotes crystallization). Alternatively, a microcrystalline semiconductor which is an SAS can be crystallized by laser irradiation to increase crystallinity. In the case where an element that promotes crystallization is not introduced, before being irradiated with laser light, an amorphous silicon film is heated at 500° C. for one hour in a nitrogen atmosphere, whereby hydrogen contained in the amorphous silicon film is released to a concentration of $1\times10^{20}$ atoms/cm$^3$ or less. This is because, if the amorphous silicon film contains much hydrogen, the amorphous silicon film is broken by laser irradiation.

There is no particular limitation on a method for introducing a metal element into the amorphous semiconductor film as long as the metal element can exist on the surface of or inside the amorphous semiconductor film. For example, a sputtering method, a CVD method, a plasma processing method (including a plasma CVD method), an adsorption method, or a coating method using a metal salt solution can be employed. Among them, the method using a solution is simple and easy, and is useful in terms of easy concentration adjustment of the metal element. At this time, an oxide film is preferably deposited by UV light irradiation in an oxygen atmosphere, a thermal oxidation method, treatment with ozone water or hydrogen peroxide including a hydroxyl radical, or the like in order to improve the wettability of the surface of the amorphous semiconductor film and to spread an aqueous solution on the entire surface of the amorphous semiconductor film.

In a crystallization step for crystallizing the amorphous semiconductor film to form a crystalline semiconductor film, an element that promotes crystallization (also referred to as a catalytic element or a metal element) may be added to the amorphous semiconductor film, and crystallization may be performed by heat treatment (at 550° C. to 750° C. for 3 minutes to 24 hours). As the element that promotes crystallization, it is possible to use one or more kinds of elements selected from iron (Fe), nickel (Ni), cobalt (Co), ruthenium (Ru), rhodium (Rh), palladium (Pd), osmium (Os), iridium (Ir), platinum (Pt), copper (Cu), or gold (Au).

In order to remove or reduce the element that promotes crystallization from the crystalline semiconductor film, a semiconductor film containing an impurity element is formed in contact with the crystalline semiconductor film so as to function as a gettering sink. As the impurity element, an impurity element imparting n-type conductivity, an impurity element imparting p-type conductivity, a rare gas element, or the like can be used. For example, it is possible to use one or more kinds of elements selected from phosphorus (P), nitrogen (N), arsenic (As), antimony (Sb), bismuth (Bi), boron (B), helium (He), neon (Ne), argon (Ar), krypton (Kr), or xenon (Xe). A semiconductor film containing a rare gas element is formed over the crystalline semiconductor film containing the element that promotes crystallization, and then heat treatment is performed (at 550° C. to 750° C. for 3 minutes to 24 hours). The element that promotes crystallization which is contained in the crystalline semiconductor film moves into the semiconductor film containing a rare gas element, and thus the element that promotes crystallization which is contained in the crystalline semiconductor film is removed or reduced. After that, the semiconductor film containing a rare gas element which has functioned as a gettering sink is removed.

The amorphous semiconductor film may be crystallized by combining thermal treatment and laser irradiation. Alternatively, either thermal treatment or laser irradiation may be performed plural times.

A crystalline semiconductor film can also be formed directly on the sealing member with a plasma method. Alternatively, a crystalline semiconductor film may be selectively formed over the sealing member with a plasma method.

It is also possible to use an oxide semiconductor such as zinc oxide (ZnO) or tin oxide (SnO$_2$) for the semiconductor layer. In the case of using ZnO for the semiconductor layer, a gate insulating layer can be formed using Y$_2$O$_3$, Al$_2$O$_3$, TiO$_2$, a stack thereof, or the like, and the gate electrode layer, the source electrode layer, and the drain electrode layer can be formed using ITO, Au, Ti, or the like. In addition, In, Ga, or the like can be added to ZnO.

As the oxide semiconductor, a thin film represented by InMO$_3$(ZnO)$_m$ (m>0) can be used. Note that M denotes one or more metal elements selected from gallium (Ga), iron (Fe), nickel (Ni), manganese (Mn), or cobalt (Co). For example, M is gallium (Ga) in some cases, and in other cases, M contains other metal elements in addition to Ga, such as Ga and Ni or Ga and Fe. Furthermore, the above oxide semiconductor may contain a transition metal element such as Fe or Ni or an oxide of the transition metal as an impurity element, in addition to a metal element contained as M. For example, an In—Ga—Zn—O-based non-single-crystal film can be used as the oxide semiconductor layer.

As the oxide semiconductor layer (the InMO$_3$(ZnO)$_m$ (m>0) film), an InMO$_3$(ZnO)$_m$ film (m>0) in which M is another metal element may be used instead of the In—Ga—Zn—O-based non-single-crystal film. As the oxide semiconductor which is applied to the oxide semiconductor layer, any of the following oxide semiconductors can be applied in addition to the above: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor.

This embodiment can be implemented in an appropriate combination with the structures described in the other embodiments.

Embodiment 7

In this embodiment, an example of an element structure of the light-emitting element used for the light-emitting device which is one embodiment of the present invention will be described.

Figure 12A:
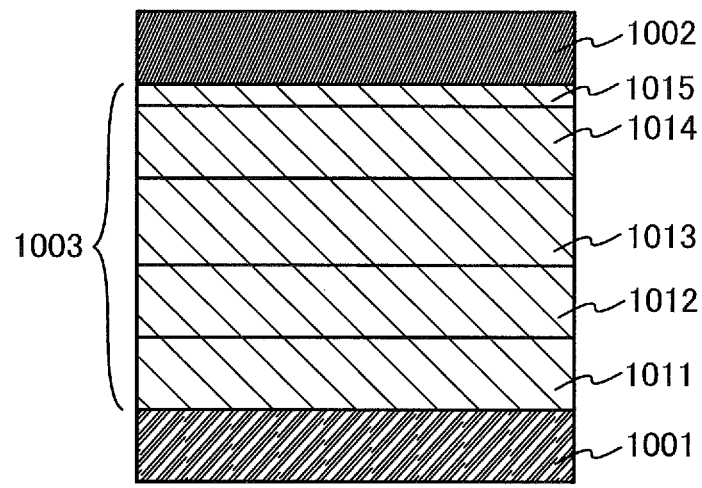
FIGS. 12A and 12B are views each illustrating a light-emitting element which can be applied to a light-emitting device.

In an element structure illustrated in FIG. 12A, an EL layer 1003 including a light-emitting region is sandwiched between a pair of electrodes (an anode 1001 and a cathode 1002).

The EL layer 1003 includes at least a light-emitting layer 1013, and may have a stacked structure including a functional layer in addition to the light-emitting layer 1013. The functional layer other than the light-emitting layer 1013 can be formed using one or more of a layer containing a substance having a high hole-injection property, a layer containing a substance having a high hole-transport property, a layer containing a substance having a high electron-transport property, a layer containing a substance having a high electron-injection property, a layer containing a bipolar substance (a substance having a high electron-transport property and a high hole-transport property), or the like. Specifically, functional layers such as a hole-injection layer 1011, a hole-transport layer 1012, a light-emitting layer 1013, an electron-transport layer 1014, or an electron-injection layer 1015 can be used in combination as appropriate.

Next, materials which can be used for the above-described light-emitting element are specifically described.

The anode 1001 is preferably formed using a metal, an alloy, a conductive compound, a mixture thereof, or the like that has a high work function (specifically, a work function of 4.0 eV or higher). Specifically, it is possible to use, for example, indium oxide-tin oxide (ITO: indium tin oxide), indium oxide-tin oxide containing silicon or silicon oxide, indium oxide-zinc oxide (IZO: indium zinc oxide), or indium oxide containing tungsten oxide and zinc oxide.

These conductive metal oxide films are generally deposited with sputtering, but may also be formed with a sol-gel method or the like. For example, a film of indium oxide-zinc oxide (IZO) can be formed with a sputtering method using a target in which 1 wt % to 20 wt % of zinc oxide is added to indium oxide. Further, a film of indium oxide containing tungsten oxide and zinc oxide can be formed with a sputtering method using a target in which 0.5 wt % to 5 wt % of tungsten oxide and 0.1 wt % to 1 wt % of zinc oxide are added to indium oxide.

Besides, it is also possible to use gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (such as titanium nitride), molybdenum oxide, vanadium oxide, ruthenium oxide, tungsten oxide, manganese oxide, titanium oxide, or the like.

The cathode 1002 can be formed using a metal, an alloy, a conductive compound, a mixture thereof, or the like that has a low work function (specifically, a work function of 3.8 eV or lower). Specific examples of the material for the cathode include an element belonging to Group 1 and an element belonging to Group 2 of the periodic table, i.e., an alkali metal such as lithium (Li) or cesium (Cs), an alkaline earth metal such as magnesium (Mg), calcium (Ca), or strontium (Sr), and an alloy containing these elements (e.g., MgAg or AlLi); and a rare earth metal such as europium (Eu) or ytterbium (Yb), and an alloy thereof. A film of an alkali metal, an alkaline earth metal, or an alloy containing such a metal can be formed with a vacuum evaporation method. An alloy film containing an alkali metal or an alkaline earth metal can also be formed with a sputtering method. Alternatively, silver paste or the like can be formed with an ink-jet method or the like.

Alternatively, the cathode 1002 can be formed by stacking a film of a metal such as aluminum and a thin film of an alkali metal compound, an alkaline earth metal compound, or a rare earth metal compound (e.g., lithium fluoride (LiF), lithium oxide ($LiO_x$), cesium fluoride (CsF), calcium fluoride ($CaF_2$), or erbium fluoride ($ErF_3$)).

In the light-emitting element shown in this embodiment, at least one of the anode 1001 and the cathode 1002 may have a light-transmitting property.

Next, specific examples of the material used for each layer of the EL layer 1003 is described below.

The hole-injection layer 1011 is a layer containing a substance having a high hole-injection property. As the substance having a high hole-injection property, for example, molybdenum oxide, vanadium oxide, ruthenium oxide, tungsten oxide, or manganese oxide can be used. Alternatively, the hole-injection layer 1011 can be formed using a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis[4-[bis(3-methylphenyl)amino]phenyl]-N,N'-diphenyl-[1,1'-biphenyl]-4,4'-diamine (abbreviation: DNTPD); a high molecular compound such as poly(3,4-ethylenedioxythiophene)/poly(styrenesulfonic acid) (PEDOT/PSS); or the like. Further alternatively, the hole-injection layer 1011 can be formed using a tris(p-enamine-substituted-aminophenyl)amine compound, a 2,7-diamino-9-fluorenylidene compound, a tri(p-N-enamine-substituted-aminophenyl) benzene compound, a pyrene compound having one or two ethenyl groups having at least one aryl group, N,N'-di(biphenyl-4-yl)-N,N'-diphenylbiphenyl-4,4'-diamine, N,N,N',N'-tetra(biphenyl-4-yl)biphenyl-4,4'-diamine, N,N,N',N'-tetra(biphenyl-4-yl)-3,3'-diethylbiphenyl-4,4'-diamine, 2,2'-(methylenedi-4,1-phenylene)bis[4,5-bis(4-methoxyphenyl)-2H-1,2,3-triazole], 2,2'-(biphenyl-4,4'-diyl)bis(4,5-diphenyl-2H-1,2,3-triazole), 2,2'-(3,3'-dimethylbiphenyl-4,4'-diyl)bis(4,5-diphenyl-2H-1,2,3-triazole), bis[4-(4,5-diphenyl-2H-1,2,3-triazol-2-yl)phenyl](methyl)amine, or the like.

The hole-injection layer 1011 can also be formed using a hole-injection composite material including an organic compound and an inorganic compound (preferably, an inorganic compound having an electron-accepting property to an organic compound). In the hole-injection composite material, electrons are transferred between the organic compound and the inorganic compound and the carrier density is increased; thus, the hole-injection composite material has excellent hole-injection and hole-transport properties.

In the case where the hole-injection layer 1011 is formed using a hole-injection composite material, the hole-injection layer 1011 can form an ohmic contact with the anode 1001; thus, the material of the anode 1001 can be selected regardless of the work function.

The inorganic compound used for the hole-injection composite material is preferably an oxide of a transition metal. Further, an oxide of metals belonging to Group 4 to Group 8 of the periodic table can also be used. Specifically, vanadium oxide, niobium oxide, tantalum oxide, chromium oxide, molybdenum oxide, tungsten oxide, manganese oxide, and rhenium oxide are preferably used because of their high electron-accepting properties. Among them, molybdenum oxide is especially preferable because it is stable in the air and has a low hygroscopic property, thereby being easily handled.

As the organic compound used for the hole-injection composite material, it is possible to use various compounds such as an aromatic amine compound, a carbazole derivative, an aromatic hydrocarbon, and a high molecular compound (an oligomer, a dendrimer, a polymer, or the like). Note that the organic compound used for the hole-injection composite material is preferably an organic compound having a high hole-transport property. Specifically, it is preferable to use a substance having a hole mobility of $10^{-6}$ $cm^2$/Ns or higher, though other substances may also be used as long as the hole-transport properties thereof are higher than the electron-transport properties thereof. The organic compounds which can be used for the hole-injection composite material are specifically described below.

Examples of the aromatic amine compound include the following: N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); N,N'-bis[4-[bis(3-methylphenyl)amino]phenyl]-N,N'-diphenyl-[1,1'-biphenyl]-4,4'-diamine (abbreviation: DNTPD); and 1,3,5-tris[N-(4-diphenylaminophenyl)-N-phenylamino]benzene (abbreviation: DPA3B).

Specific examples of the carbazole derivative which can be used for the hole-injection composite material include the following: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1).

Further, as the carbazole derivative, it is also possible to use the following: 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 1,4-bis[4-(N-carbazolyl)phenyl]-2,3,5,6-tetraphenylbenzene; or the like.

Examples of the aromatic hydrocarbon which can be used for the hole-injection composite material include the following: 2-tert-butyl-9,10-di(2-naphthy)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; and 2,5,8,11-tetra(tert-butyl)perylene. Besides, pentacene, coronene, or the like can also be used. Further, it is more preferable to use an aromatic hydrocarbon that has a hole mobility of $1\times10^{-6}$ cm$^2$/Vs or higher and has 14 to 42 carbon atoms.

The aromatic hydrocarbon which can be used for the hole-injection composite material may have a vinyl skeleton. Examples of the aromatic hydrocarbon having a vinyl skeleton include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Examples of the high molecular compound which can be used for the hole-injection composite material include poly(N-vinylcarbazole) (abbreviation: PVK) and poly(4-vinyltriphenylamine) (abbreviation: PVTPA).

The hole-transport layer 1012 is a layer containing a substance having a high hole-transport property. The substance having a high hole-transport property is preferably an aromatic amine compound (i.e., a compound having a benzene ring-nitrogen bond), for example. Widely used examples of the material are as follows: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4"-tris(N,N-diphenyl-amino)triphenylamine or 4,4',4"-tris[N-(3-methylphenyl)-N-phenylamino]triphenylamine. These substances are mainly substances having a hole mobility of $10^{-6}$ cm$^2$/Vs or higher, though other substances may also be used as long as the hole-transport properties thereof are higher than the electron-transport properties thereof. Note that the hole-transport layer 1012 is not limited to a single layer, but may be a mixed layer of the above-described substances, or stacked layers of two or more layers containing the above-described substances.

Alternatively, a hole-transport material may be added to a high molecular compound such as PMMA, which is electrically inactive.

Further alternatively, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis(4-butylphenyl)-N,N'-bis(phenyl)benzidine] (abbreviation: Poly-TPD) may be used. Furthermore, the above-described hole-transport material may be added to those high molecular compounds as appropriate. Further, the hole-transport layer 1012 can also be formed using a tris(p-enamine-substituted-aminophenyl)amine compound, a 2,7-diamino-9-fluorenylidene compound, a tri(p-N-enamine-substituted-aminophenyl)benzene compound, a pyrene compound having one or two ethenyl groups having at least one aryl group, N,N'-di(biphenyl-4-yl)-N,N'-diphenylbiphenyl-4,4'-diamine, N,N,N',N'-tetra(biphenyl-4-yl)biphenyl-4,4'-diamine, N,N,N',N'-tetra(biphenyl-4-yl)-3,3'-diethylbiphenyl-4,4'-diamine, 2,2'-(methylenedi-4,1-phenylene)bis[4,5-bis(4-methoxyphenyl)-2H-1,2,3-triazole], 2,2'-(biphenyl-4,4'-diyl)bis(4,5-diphenyl-2H-1,2,3-triazole), 2,2'-(3,3'-dimethylbiphenyl-4,4'-diyl)bis(4,5-diphenyl-2H-1,2,3-triazole), bis[4-(4,5-diphenyl-2H-1,2,3-triazol-2-yl)phenyl](methyl)amine, or the like.

The light-emitting layer 1013 is a layer containing a light-emitting substance, and can be formed using a wide variety of materials. For example, a fluorescent compound that exhibits fluorescence or a phosphorescent compound that exhibits phosphorescence can be used as the light-emitting substance. Organic compound materials which can be used for the light-emitting layer is shown below, though the materials which can be used for the light-emitting element are not limited to the following examples.

Blue to blue-green light emission can be obtained, for example, using perylene, 2,5,8,11-tetra-t-butylperylene (abbreviation: TBP), 9,10-diphenylanthracene, or the like as a guest material, and dispersing the guest material in a suitable host material. Blue to blue-green light emission can also be obtained from a styrylarylene derivative such as 4,4'-bis(2,2-diphenylvinyl)biphenyl (abbreviation: DPVBi) or an anthracene derivative such as 9,10-di-2-naphthylanthracene (abbreviation: DNA) or 9,10-bis(2-naphthyl)-2-t-butylanthracene (abbreviation: t-BuDNA). Alternatively, a polymer such as poly(9,9-dioctylfluorene) may be used. As a guest material for blue light emission, a styrylamine derivative is preferably used, and examples thereof include N,N'-bis[4-(9H-carbazol-9-yl)phenyl]-N,N'-diphenylstilbene-4,4'-diamine (abbreviation: YGA2S) and N,N'-diphenyl-N,N'-bis(9-phenyl-9H-carbazol-3-yl)stilbene-4,4'-diamine (abbreviation: PCA2S). Among them, YGA2S is preferably used because it has a peak at around 450 nm. As a host material, an anthracene derivative such as 9,10-bis(2-naphthyl)-2-t-butylanthracene (abbreviation: t-BuDNA) or 9-[4-(10-phenyl-9-anthryl)phenyl]-9H-carbazole (abbreviation: CzPA) is preferably used. Among them, CzPA is preferably used because it is electrochemically stable.

Blue-green to green light emission can be obtained, for example, using a coumarin dye such as coumarin 30 or coumarin 6; bis[2-(2,4-difluorophenyl)pyridinato]picolinatoiridium (abbreviation: FIrpic); bis(2-phenylpyridinato)acetylacetonatoiridium (abbreviation: Ir(ppy)$_2$(acac)); or the like as a guest material and dispersing the guest material in a suitable host material. Blue-green to green light emission can also be obtained by dispersing the above-described perylene or TBP in a suitable host material at a high concentration of 5 wt % or more. Alternatively, blue-green to green light emission can be obtained from a metal complex such as BAlq, Zn(BTZ)$_2$, or bis(2-methyl-8-quinolinolato)chlorogallium (Ga(mq)$_2$Cl). Further alternatively, a polymer such as poly(p-phenylenevinylene) may be used. As a guest material for a blue-green to green light-emitting layer, an anthracene derivative is preferably used because high emission efficiency can be obtained. For example, blue-green light emission with high efficiency can be obtained using 9,10-bis{4-[N-(4-diphenylamino)phenyl-N-phenyl]aminophenyl}-2-tert-butylanthracene (abbreviation: DPABPA). Further, an anthracene derivative in which an amino group has been substituted into the 2-position is preferably used because green light emission with high efficiency can be obtained. In particular, N-(9,10-diphenyl-2-anthryl)-N,9-diphenyl-9H-carbazol-3-amine (abbreviation: 2PCAPA) that has a long life is preferably used. As a host material for these materials, an anthracene derivative is preferably used, and the above-described CzPA is preferably used because it is electrochemically stable. Further, in the case where a light-emitting element having two peaks in the blue to green wavelength range is manufactured combining green light emission and blue light emission, an anthracene derivative having an electron-transport property, such as CzPA, is preferably used as a host material for a blue-light-emitting layer and an aromatic amine compound having a hole-transport property, such as NPB, is preferably used as a host material for a green-light-emitting layer, so that light emission can be obtained at the interface between the blue-light-emitting layer and the green-light-emitting layer. That is, in such a case, an aromatic amine compound like NPB is preferably used as a host material of a green-light-emitting material such as 2PCAPA.

Yellow to orange light emission can be obtained, for example, using rubrene; 4-(dicyanomethylene)-2-[p-(dimethylamino)styryl]-6-methyl-4H-pyran (abbreviation: DCM1); 4-(dicyanomethylene)-2-methyl-6-(9-julolidyl)ethenyl-4H-pyran (abbreviation: DCM2); bis[2-(2-thienyl)pyridinato]acetylacetonatoiridium (abbreviation: Ir(thp)$_2$(acac)); bis(2-phenylquinolinato)acetylacetonatoiridium (abbreviation: Ir(pq)$_2$(acac)); or the like as a guest material and dispersing the guest material in a suitable host material. In particular, a tetracene derivative such as rubrene is preferably used as a guest material because it is highly efficient and chemically stable. As a host material in that case, an aromatic amine compound such as NPB is preferably used. Alternatively, a metal complex such as bis(8-quinolinolato)zinc (abbreviation: Znq$_2$) or bis[2-cinnamoyl-8-quinolinolato]zinc (abbreviation: Znsq$_2$) can be used as a host material. Further alternatively, a polymer such as poly(2,5-dialkoxy-1,4-phenylenevinylene) may be used.

Orange to red light emission can be obtained, for example, using 4-(dicyanomethylene)-2,6-bis[p-(dimethylamino)styryl]-4H-pyran (abbreviation: BisDCM); 4-(dicyanomethylene)-2,6-bis[2-(julolidin-9-yl)ethynyl]-4H-pyran (abbreviation: DCM1); 4-(dicyanomethylene)-2-methyl-6-(9-julolidyl)ethenyl-4H-pyran (abbreviation: DCM2); bis[2-(2-thienyl)pyridinato]acetylacetonatoiridium (abbreviation: Ir(thp)$_2$(acac)), or the like as a guest material, and dispersing the guest material in a suitable host material. Orange to red light emission can also be obtained from a metal complex such as bis(8-quinolinolato)zinc (abbreviation: Znq$_2$) or bis[2-cinnamoyl-8-quinolinolato]zinc (abbreviation: Znsq$_2$). Alternatively, a polymer such as poly(3-alkylthiophene) may be used. As a guest material exhibiting red light emission, it is preferable to use a 4H-pyran derivative that has high emission efficiency, such as 4-(dicyanomethylene)-2,6-bis[p-(dimethylamino) styryl]-4H-pyran (abbreviation: BisDCM), 4-(dicyanomethylene)-2,6-bis[2-(julolidin-9-yl)ethynyl]-4H-pyran (abbreviation: DCM1), 4-(dicyanomethylene)-2-methyl-6-(9-julolidyl)ethenyl-4H-pyran (abbreviation: DCM2), {2-isopropyl-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTI), or {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbreviation: BisDCJTM). Among them, DCJTI and BisDCJTM are preferably used because they have an emission peak at around 620 nm.

Note that the light-emitting layer 1013 may have a structure in which any of the above light-emitting substances (guest materials) is dispersed in another substance (a host material). A substance having a high light-emitting property can be dispersed in various kinds of substances, and it is preferably dispersed in a substance that has a lowest unoccupied molecular orbital (LUMO) level higher than that of the substance having a high light-emitting property and has a highest occupied molecular orbital (HOMO) level lower than that of the substance having a high light-emitting property.

Specific examples of the substance in which the light-emitting substance is dispersed are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), or bathocuproine (abbreviation: BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), or 6,12-dimethoxy-5,11-diphenylchrysene; and an aromatic amine compound such as N,N-diphenyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB.

Further, as the substance into which the light-emitting substance is dispersed, a plurality of kinds of substances can be used. For example, a substance such as rubrene, which suppresses crystallization, may be further added in order to prevent crystallization. Moreover, NPB, Alq, or the like may be further added in order to increase the efficiency in energy transfer to the light-emitting substance.

By dispersing a light-emitting substance in another substance, crystallization of the light-emitting layer 1013 can be suppressed. Furthermore, it is also possible to suppress concentration quenching due to a high concentration of a light-emitting substance.

The electron-transport layer 1014 is a layer containing a substance having a high electron-transport property. Examples of the substance having a high electron-transport property include a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), can be used. Besides the metal complexes, it is also possible to use 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), bis[3-(1H-benzimidazol-2-yl)fluoren-2-olato]zinc(II), bis[3-(1H-benzimidazol-2-yl)fluoren-2-olato]beryllium(II), bis[2-(1H-benzimidazol-2-yl)dibenzo[b, d]furan-3-olato](phenolato)aluminum(III), bis[2-(benzoxazol-2-yl)-7,8-methylenedioxydibenzo[b,d]furan-3-olato](2-naphtholato)aluminum(III), or the like. The substances described here are mainly substances having an electron mobility of $10^{-6}$ cm$^2$/Vs or higher, though the electron-transport layer 1014 may be formed using other substances as long as the electron-transport properties thereof are higher than the hole-transport properties thereof. Note that the electron-transport layer 1014 is not limited to a single layer, but may be stacked layers of two or more layers containing the above-described substances.

The electron-injection layer 1015 is a layer containing a substance having a high electron-injection property. Examples of the substance having a high electron-injection property include an alkali metal, an alkaline earth metal, and a compound of these metals, such as lithium fluoride (LiF), cesium fluoride (CsF), or calcium fluoride (CaF$_2$). It is also possible to use an electron-injection composite material including an organic compound (preferably, an organic compound having an electron-transport property) and an inorganic compound (preferably, an alkali metal, an alkaline earth metal, a rare earth metal, or a compound of these metals). As the electron-injection composite material, for example, a layer formed using Alq mixed with magnesium (Mg) can be used. Such a structure increases the efficiency in electron injection from the cathode 1002.

In the case where the electron-injection layer 1015 is formed using the above-described electron-injection composite material, a variety of conductive materials such as Al, Ag, ITO, or ITO containing silicon or silicon oxide can be used as the material of the cathode 1002 regardless of the work function.

The EL layer 1003 can be formed stacking the above layers in appropriate combination. Note that the light-emitting layer 1013 may have a stacked structure of two or more layers. When the light-emitting layer 1013 has a stacked structure of two or more layers and the kind of light-emitting substance for each light-emitting layer is changed, various emission colors can be obtained. In addition, plural kinds of light-emitting substances having different emission colors are used, so that light emission with a broad spectrum or white light emission can also be obtained. A light-emitting layer having a stacked structure is preferably used particularly for a lighting device that requires high luminance.

As a method for forming the EL layer 1003, various methods (e.g., a dry process or a wet process) which depend on a material used can be selected as appropriate. For example, a vacuum evaporation method, a sputtering method, an ink-jet method, or a spin coating method can be used. Each layer of the EL layer 1003 may be formed with a different method.

Further, the light-emitting element shown in this embodiment can be formed by various methods regardless of whether it is a dry process (e.g., a vacuum evaporation method or a sputtering method) or a wet process (e.g., an ink-jet method or a spin coating method).

Figure 12B:
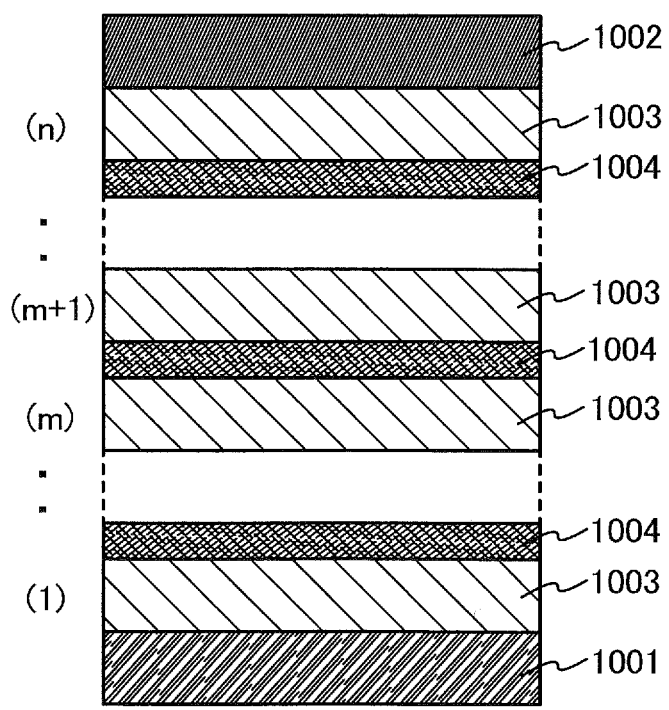

The light-emitting element shown in this embodiment may have a structure illustrated in FIG. 12B, a so-called stacked element structure in which a plurality of the EL layers 1003 are stacked between a pair of electrodes. Note that in the case where the El layer 1003 has a stacked structure including, for example, n layers (n is a natural number of two or more), an intermediate layer 1004 is provided between an m-th (m is a natural number, 1≤m≤n−1) EL layer and an (m+1)-th EL layer.

The intermediate layer 1004 has a function of, when a voltage is applied to the anode 1001 and the cathode 1002, injection of electrons to one of the EL layers 1003 in contact with the intermediate layer 1004, which is on the anode 1001 side, and injection of holes to the other EL layer 1003 on the cathode 1002 side.

The intermediate layer 1004 can be formed using the above-described composite materials (a hole-injection composite material or an electron-injection composite material) of an organic compound and an inorganic compound, metal oxides, and the like in appropriate combination. More preferably, the intermediate layer 1004 is formed using a combination of a hole-injection composite material and other materials. Such materials used for the intermediate layer 1004 have excellent carrier-injection properties and carrier-transport properties, whereby a light-emitting element driven with low current and low voltage can be realized.

In the case where an EL layer has two stacked layers in the stacked element structure, white light emission can be extracted outside by allowing a first EL layer and a second EL layer to emit light of complementary colors. Note that white light emission can also be obtained in a structure in which each of the first EL layer and the second EL layer includes a plurality of light-emitting layers emitting light of complementary colors. Examples of complementary colors include blue and yellow, and blue-green and red. A substance emitting light of blue, yellow, blue-green, or red may be selected as appropriate from, for example, the light-emitting substances given above.

The following is an example of the structure in which each of the first EL layer and the second EL layer includes a plurality of light-emitting layers emitting light of complementary colors.

For example, the first EL layer includes a first light-emitting layer that emits light having an emission spectrum with a peak in the blue to blue-green wavelength range, and a second light-emitting layer that emits light having an emission spectrum with a peak in the yellow to orange wavelength range. The second EL layer includes a third light-emitting layer that emits light having an emission spectrum with a peak in the blue-green to green wavelength range, and a fourth light-emitting layer that emits light having an emission spectrum with a peak in the orange to red wavelength range.

In this case, light emission from the first EL layer is a combination of light emission from both the first light-emitting layer and the second light-emitting layer and thus exhibits an emission spectrum having peaks both in the blue to blue-green wavelength range and in the yellow to orange wavelength range. That is, the first EL layer emits light of two-wavelength white color or almost white color.

Further, light emission from the second EL layer is a combination of light emission from both the third light-emitting layer and the fourth light-emitting layer and thus exhibits an emission spectrum having peaks both in the blue-green to green wavelength range and in the orange to red wavelength range. That is, the second EL layer emits light of two-wavelength white color or almost white color, which is different from that of the first EL layer.

Accordingly, a combination of the light-emission from the first EL layer and the light emission from the second EL layer provides white light emission that covers the blue to blue-green wavelength range, the blue-green to green wavelength range, the yellow to orange wavelength range, and the orange to red wavelength range.

Note that in the above-described stacked element structure, the intermediate layer between the stacked EL layers allows the element to have a long lifetime in a high-luminance region while the current density is kept low. In addition, the voltage drop due to the resistance of the electrode material can be reduced, resulting in uniform light emission in a large area.

This embodiment can be implemented in an appropriate combination with the structures described in the other embodiments.

Embodiment 8

A light-emitting device disclosed in this specification can be applied to a variety of electronic appliances (including an amusement machine). Examples of electronic appliances include a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, and a large-sized game machine such as a pachinko machine.

In this embodiment, an example of a cellular phone using the light-emitting device disclosed in this specification is described with reference to FIGS. 10A to 10D and FIG. 11.

FIG. 10C is a front view of the cellular phone; FIG. 10D, a side view; and FIG. 10B, a top view. The cellular phone includes a housing 1411a and a housing 1411b, which include a light-transmitting supporting member at least in a region to be a display area. FIG. 10A is a cross-sectional view of the inside of the housing 1411a and the housing 1411b. The front of the housing 1411a has a rectangular shape with a longer side and a shorter side, which may have a round corner. In this embodiment, the direction parallel to the longer side of the rectangle that is the front shape is referred to as a longitudinal direction, and the direction parallel to the shorter side thereof is referred to as a lateral direction.

The sides of the housing 1411a and the housing 1411b also have a rectangular shape with a longer side and a shorter side, which may have a round corner. In this embodiment, the direction parallel to the longer side of the rectangle that is the side shape is referred to as a longitudinal direction, and the direction parallel to the shorter side is referred to as a depth direction.

The cellular phone illustrated in FIGS. 10A to 10D includes a display area 1413, operating buttons 1404, and a touch panel 1423, and the housings 1411a and 1411b include a light-emitting panel 1421 and a wiring board 1425. The touch panel 1423 may be provided as needed.

As the light-emitting panel 1421, the light-emitting panel and the light-emitting module described in Embodiments 1 to 7 may be used.

As illustrated in FIGS. 10B and 10C, the light-emitting panel 1421 is arranged along the shape of the housing 1411a so as to cover not only the front area on the viewer side but also part of the top area and the bottom area. Accordingly, a display area 1427 can be formed on the top of the cellular phone in the longitudinal direction to be connected to the display area 1413. That is, the display area 1427 is provided also on the top surface of the cellular phone, which makes it possible to see the display area 1427 without taking out the cellular phone from, for example, the breast pocket.

On the display areas 1413 and 1427, incoming mails or calls, dates, phone numbers, personal names, and the like may be displayed. Display may be performed only in the display area 1427 and not be performed in the other regions as needed, resulting in saving of energy.

Figure 11:
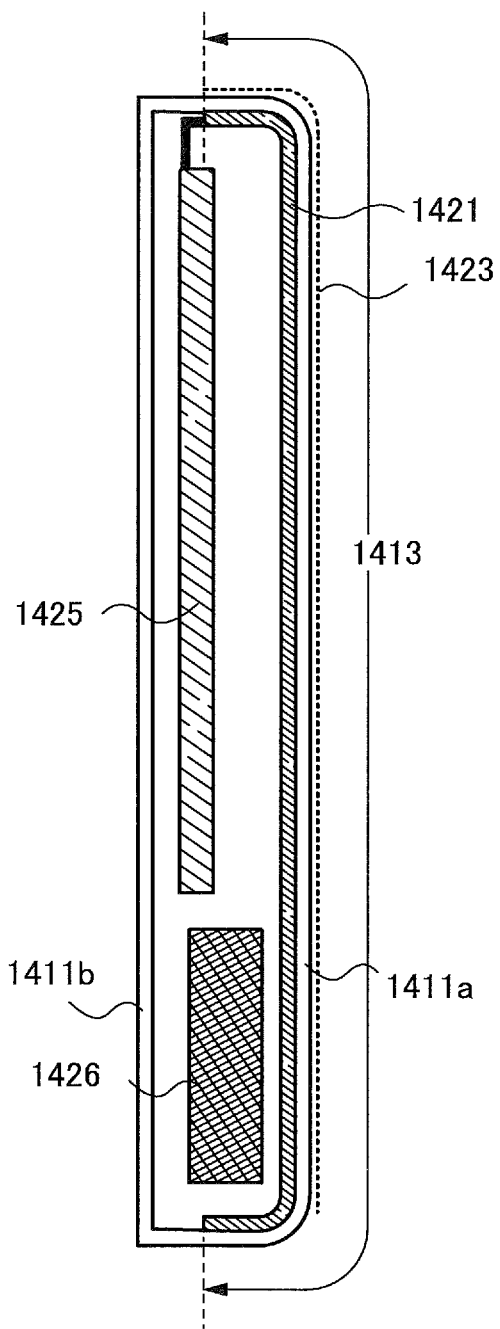
FIG. 11 is a view illustrating an example of a cellular phone to which a light-emitting device is applied.

FIG. 11 is a cross-sectional view of FIG. 10D. As illustrated in FIG. 11, the light-emitting panel 1421 is continuously provided on the top, front, and bottom of the inside of the housing 1411a. A battery 1426 and the wiring board 1425 electrically connected to the light-emitting panel 1421 are provided on the backside of the light-emitting panel 1421. Furthermore, the touch panel 1423 is provided on the outside of the housing 1411a (on the viewer side).

Images and letters can be displayed on the cellular phone of this embodiment, whether it is placed horizontally or vertically for a landscape mode or a portrait mode.

The light-emitting panel 1421 is not manufactured separately in the front area and the top area, but manufactured to cover both the front display area 1413 and the top display area 1427, whereby manufacturing cost and time can be reduced.

The touch panel 1423 is provided on the housing 1411a, and buttons 1414 of the touch panel are displayed on the display area 1413. By touching the buttons 1414 with a finger or the like, contents displayed on the display area 1413 can be controlled. Furthermore, making calls or composing mails can also be performed by touching the buttons 1414 on the display area 1413 with a finger or the like.

The buttons 1414 of the touch panel 1423 may be displayed when needed, and images or letters can be displayed on the entire display area 1413 when the buttons 1414 are not necessary.

Furthermore, the upper longer side in a cross section of the cellular phone may also have a curvature radius. When the cellular phone is formed so that the cross section thereof has a curvature radius in the upper long side, the light-emitting panel 1421 and the touch panel 1423 also have a curvature radius in an upper longer side in a cross section. In addition, the housing 1411a also has a curved shape. In other words, the display area 1413 on the front is curved outwards.

The present application is based on Japanese Patent Application serial No. 2009-122664 filed with Japan Patent Office on May 21, 2009, the entire contents of which are hereby incorporated by reference.

What is claimed is:

1. A light-emitting module comprising:
a housing comprising a planar portion, and a first curved portion and a second curved portion which are extended from the planar portion; and
an active-matrix light-emitting panel having a flexibility,
wherein the active-matrix light-emitting panel is bonded to the housing with an adhesive layer,
wherein a display portion of the active-matrix light-emitting panel comprises a first portion in contact with the planar portion, a second portion in contact with the first curved portion, and a third portion in contact with the second curved portion, and
wherein a periphery of the display portion overlaps with a fourth portion which is located inside to a periphery of the planar portion in a plan view.

2. The light-emitting module, according to claim 1,
wherein the active-matrix light-emitting panel comprises a connection terminal electrode electrically connected to an FPC, and
wherein the connection terminal electrode overlaps with the fourth portion.

3. The light-emitting module, according to claim 2,
wherein the active-matrix light-emitting panel comprises a connection terminal electrode electrically connected to an FPC, and
wherein the connection terminal electrode overlaps with a fifth portion between the periphery of the display portion and the periphery of the planar portion.

4. The light-emitting module, according to claim 1,
wherein the active-matrix light-emitting panel is bonded to the housing with the adhesive layer so that the active-matrix light-emitting panel has a shape reflecting a shape of the housing.

5. A light-emitting module comprising:
a housing comprising a planar portion, and a first curved portion and a second curved portion which are extended from the planar portion;
an active-matrix light-emitting panel including an organic EL element; and
an adhesive layer between the active-matrix light-emitting panel and the housing,
wherein a display portion of the active-matrix light-emitting panel comprises a first portion in contact with the planar portion, a second portion in contact with the first curved portion, and a third portion in contact with the second curved portion, and
wherein a periphery of the display portion overlaps with a fourth portion which is located inside to a periphery of the planar portion in a plan view.

6. The light-emitting module, according to claim 5,
wherein the active-matrix light-emitting panel comprises a connection terminal electrode electrically connected to an FPC, and
wherein the connection terminal electrode overlaps with the fourth portion.

7. The light-emitting module, according to claim 5,
wherein the active-matrix light-emitting panel comprises a connection terminal electrode electrically connected to an FPC, and
wherein the connection terminal electrode overlaps with a fifth portion between the periphery of the display portion and the periphery of the planar portion.

8. The light-emitting module, according to claim 5,
wherein the active-matrix light-emitting panel is bonded to the housing with the adhesive layer so that the active-matrix light-emitting panel has a shape reflecting a shape of the housing.

* * * * *